(12) United States Patent
Huang et al.

(10) Patent No.: US 8,183,539 B2
(45) Date of Patent: May 22, 2012

(54) HIGH MASS RESOLUTION LOW ABERRATION ANALYZER MAGNET FOR RIBBON BEAMS AND THE SYSTEM FOR RIBBON BEAM ION IMPLANTER

(76) Inventors: Yongzhang Huang, Hamilton, MA (US); Xinping Hu, Chengdu (CN)

( * ) Notice: Subject to any disclaimer, the term of this patent is extended or adjusted under 35 U.S.C. 154(b) by 287 days.

(21) Appl. No.: 12/658,679

(22) Filed: Feb. 12, 2010

(65) Prior Publication Data

US 2010/0243879 A1    Sep. 30, 2010

Related U.S. Application Data

(60) Provisional application No. 61/210,870, filed on Mar. 24, 2009, provisional application No. 61/268,087, filed on Jun. 8, 2009.

(51) Int. Cl.
*H01J 3/20* (2006.01)
*H01J 37/14* (2006.01)
*H01J 49/20* (2006.01)

(52) U.S. Cl. ....... 250/396 ML; 250/396 R; 250/492.21; 250/298; 250/281; 250/423 R

(58) Field of Classification Search ........... 250/396 ML, 250/396 R, 492.21, 298, 281, 423 R
See application file for complete search history.

(56) References Cited

U.S. PATENT DOCUMENTS

| 5,389,793 | A  | * | 2/1995  | Aitken et al.     | 250/492.21 |
| 5,834,786 | A  | * | 11/1998 | White et al.      | 250/492.21 |
| 6,770,888 | B1 | * | 8/2004  | Benveniste et al. | 250/396 ML |
| 7,414,249 | B2 | * | 8/2008  | Purser et al.     | 250/396 ML |

* cited by examiner

*Primary Examiner* — Nikita Wells

(57) ABSTRACT

The present invention provides a mass analyzing magnet which can bend a very wide charged particle ribbon beams through angles between 90 to 200 degrees. The shorter dimension of the ribbon beam is aligned with the magnetic field. The magnet can focus the longer dimension of the ribbon beam through a resolving slot inside the magnet for mass or momentum analysis. The magnet pole is shaped to increase the mass resolving power and to provide the focusing force in the direction of the shorter dimension of the ribbon beam. This magnet can achieve high mass resolving power with very small system aberrations for very wide ribbon beam. This feature is of significant value, for example, in the ion implantation industry. The ribbon beam width can be 300 mm, 450 mm and even 1000 mm. Integrated with the present invention, the ion implanter systems can be built to provide mass analyzed ribbon beams for various applications. The system will have much lower cost and much better ribbon beam quality than the ion implanters which are using conventional mass analyzing magnet.

21 Claims, 28 Drawing Sheets

Beamlet in phase space

Ribbon beam in real space

View A-A

View A-A

HIGH MASS RESOLUTION LOW ABERRATION ANALYZER MAGNET FOR RIBBON BEAMS AND THE SYSTEM FOR RIBBON BEAM ION IMPLANTER

CROSS-REFERENCE TO RELATED APPLICATIONS

This application claims priority to the U.S. Provisional Patent Application No. 61/210,870 filed on Mar. 24, 2009 and the U.S. Provisional Patent Application No. 61/268,087 filed on Jun. 8, 2009. This application also claims priority under the Paris convention of Chinese Patent Application No. 200910060092.1 filed on Jul. 23, 2009.

FIELD OF THE INVENTION

The present invention is concerned generally with mass analyzing ribbon shaped ion beams; it is directly specific to magnets which are able to bend a high aspect ratio ribbon ion beam, and focus the ion beam for mass analysis with high resolution, high acceptance and small aberration. The present invention is also concerned generally with the integration of ion beam systems with invented magnets to provide mass analyzed ribbon shaped ion beams for various applications.

BACKGROUND OF THE INVENTION

The doping of semiconductors with electrically active elements is now performed almost exclusively by ion implanters. Several recent trends in semiconductor technologies suggest characteristics that would be desirable in the design of ion implanters. These trends include the following:

For silicon wafers, the standard wafer size has been increased over the years until 300 mm is the standard diameter used in new facilities today, and manufacturers are planning for 450 mm and larger.

For flat panel displays, dimensions today exceed 550 mm, and larger sizes are to be expected.

As the density of semiconductor chips increases, the implant energy requirements at high doses are decreasing. High doses of boron at energies between 0.1 and 2 KeV will be required of future process tools.

Processes require the ability to control the uniformity of the ion beam density on the semiconductor substrates. Variation across the wafer can cause process failures.

Processes also require the ability to control the angle of incidence of the ion beam on the semiconductor substrates. Angle variation across the wafer can cause process failures.

Processes require the ability to control the energy purity of the ion beam on the semiconductor substrates. Energy contamination can cause process failures as well.

Processes require the ability to prevent the particles coming along with the ion beam density from the upstream beamline from striking the semiconductor substrates. This particle contamination can cause low yield.

A typical ion implanter includes an ion source for generating the ion beam, a beamline system including mass analysis apparatus for mass resolving the ion beam using magnetic fields, as well as a target chamber containing the semiconductor wafer to be implanted by the ion beam. For low energy implantation systems, a deceleration apparatus is sometimes provided between the mass analysis magnet and the target chamber for decelerating the ions to low energies.

In the field of ion beam systems, it is sometimes desired to generate purified ion beams in the form of ribbon-shaped beams. These ribbon beams are commonly used in ion implanter apparatus and implantation systems where a workpiece (such as a silicon wafer or flat panel display) is moved through the ion beam. In these instances, the ribbon ion beam will desirably have a high aspect-ratio such that the beam is wider than any size of the workpiece undergoing implantation; so that in a single pass through the ion beam, a uniform dose of ions may be implanted onto a surface and into the internal substance of the workpiece. In the performance of these applications, it is also very desirable that the ribbon beam has its ion trajectories moving in a parallel direction and be carefully controlled to present a uniform current density profile suitable for the uniform implantation of ions into silicon wafers or flat glass panels.

Among the ion implanter apparatus and implantation systems commercially offered for sale today are those sold for ion beam implantation of flat panel displays (or "FPD's") by Sumitomo Eaton Nova Corporation (Toyo, Japan), and Ishikawajima-Harima Heavy Industries Co. Ltd. (Tokyo, Japan). These commercially sold systems have, in the past, constituted apparatus and ion beams with little to no ability to reject contaminant species that are almost always present in the beam as it leaves the ion source.

In contrast, Mitsui Engineering and Shipbuilding manufactures implantation apparatus and systems for commercial sale which are able to implant flat panel displays with uniform ribbon beams which have been mass analyzed using magnets that have only modest resolving power (i.e., approximately 2 power)—which is often sufficient to remove the egregious species contaminants from ion beams of several different, commercially useful source elements (See Prior Art FIG. 1, reproduced from U.S. Pat. No. 5,834,786).

Also, Varian Semiconductor Associates Inc. manufactures ion implanters for the implantation of silicon wafers which, in contrast with the aforementioned implanters for flat-panel displays, is an apparatus that uses two different magnets to generate a suitable ribbon-shaped beam. The first magnet mass-analyzes the ion beam; and the second magnet renders the ions in the beam parallel. The resolving power in this Varian two magnet system is as good as any other commercially available ion implanter can provide, and typically exceeds 80 m/dm FWHM. For this reason, this structural format—the two magnetic system—has become the de facto standard for ion beam uniformity and purity and is the system against which all other ribbon-beam implantation systems are currently judged. Unfortunately however, this two-magnet system has severe drawbacks: it is complex and expensive; and is only manufactured to produce ribbon ion beams up to 300 mm in size (See Prior Art FIG. 2, reproduced from U.S. Pat. No. 5,350,926).

Due to the complex interactions between the ion beam and the magnetic field applied for beam expansion, this approach creates severe technical, practical, and process-related problems that increase the total production cost of such equipment and lead to more complicated operation procedures for carrying out the ion implantation. In particular, the beam path through this system is relatively long, and at low energies and high beam currents it becomes increasingly difficult to control the uniformity of the ion beam and the angular variation within the beam to meet the precision required by certain commercial processes.

Nissin Ion Equipment Co. Ltd. (Kyoto, Japan) developed another magnet system to provide ribbon beam for implanting flat panel displays which uses a single large bending magnet, and which achieves a higher magnet resolving power than was available in prior systems. In this Nissin system, the longer (width) dimension of the ribbon-shaped beam is determined by the size of the ion source; and the open spatial gap in the analyzing magnet (from North to South magnetic pole) across which the magnetic field must be developed is larger in size than the dimensions of the ion beam. Structurally, the Nissin analyzer magnet has a steel yoke which is substantially rectangular in configuration and cross-section; wire coils are wound around the sides of this rectangular yoke, more-or-less uniformly; and the coils are subdivided so that the current density may be varied as needed, and thereby control the uniformity of the magnetic field generated within the yoke (See Prior Art FIGS. 3a and 3b respectively, reproduced from U.S. Pat. No. 6,160,262).

Also Advanced Ion Beam Technology (AIBT) has developed another magnet system to produce mass analyzed ribbon beam. An ion source with a slotted aperture produces a divergent ribbon beam. A magnet bends the ribbon beam through an angle between 45 degrees and 110 degrees, and focuses in the direction in which the beam is bent, but does not focus in the direction of the magnetic field. The magnet is similar to the magnet in FIG. 3, but uses so-called bed-stand coil to reduce the fringe field. As a result, the ion beam leaving the magnet is focused to a line focus of high aspect ratio. A lens positioned about the beam near this focus generates a quadrupole magnetic field which provides focusing to cause trajectories diverging in the direction of the long axis of the ion source slot to become approximately parallel. A target may be passed through the parallel beam, thereby implanting across its face a dose of ions with little or no variation in the incident angle of the ions across said surface. (See Prior Art FIG. 4, reproduced from U.S. Pat. No. 7,112,789).

In 2002, Benveniste disclosed a system [See prior art FIG. 6, reproduced from U.S. Pat. No. 6,885,014] which also used two magnets: the first magnet achieved high resolving power in a beam that is a ribbon beam from a ribbon ion source; and the second magnet formed the ions into a parallel beam. The short axis of the beam was aligned with the magnetic field. The significant feature of this system is: it uses a ribbon ion source to provide parallel ribbon ion beam as the input beam for the magnet system.

For ion implanter systems, the system aberration is how identical of the ribbon ion beam seen by the work piece. The no aberration ribbon beam means that each beamlet at different positions of the ribbon beam shall have the same emittance in both the x and the y planes. Any difference in emittance of each beamlet is called an aberration. If the aberration is large, this will cause large variation in the implantation. In the practical world, the magnet design needs to reduce the second order aberration to a certain level. FIG. 5 shows the beamlets at the different positions of a ribbon beam, it also shows the emittance of plot in x-x' and y-y' planes of a beamlet.

For example, look at the magnet system in FIG. 2. The first magnet is the mass analyzer magnet which has be designed to reduce the second order aberration. The second magnet is the angle correction magnet which is also designed to reduce the second order aberration. However, the ribbon beam that these two magnets produce still has large aberrations. The fundamental reason is that each beamlet goes through the magnets along different paths where the beamlet's moving velocity vector of V has a different interaction angle with the local magnetic field vector B. According to the Lorentz force, $F=qV*B$, each beamlet receives different force from the magnetic field. In the end, this brings aberration to the ribbon beam. This aberration can be amplified by the decel system which is one of the reasons that the implanter system of FIG. 2 has difficulty in producing productive low energy ion beams.

Based on the above different mass analyzer magnet, different ion implanter systems have been developed to produce ribbon beams. However, because of the unsatisfactory performance of the mass analyzer magnet, these types of ion implantation systems often are not a viable solution for performing serial mode implantation with a high-current, high-uniformity ion beam that has controllable shapes and sizes. There is a need in the art of integrated circuit fabrication to provide a new system configuration, for generating a high current ion beam that has improved uniformity without requiring additional components in order to reduce the production cost and simplifying the manufacturing processes.

SUMMARY OF THE INVENTION

The following presents a simplified summary in order to provide a basic understanding of one or more aspects of the invention. This summary is not an extensive overview of the invention, and is neither intended to identify key elements of the invention, nor to delineate the scope thereof. Rather, the primary purpose of the summary is to present some concepts of the invention in a simplified form as a prelude to the more detailed description that is presented later. The present invention is directed to methods and apparatus for implanting workpieces using an ribbon shaped ion beam, by which the above mentioned and other shortcomings associated with the prior art may be overcome or mitigated. In particular, the invention provides implantation systems wherein a broad ribbon-shaped ion beam is produced by an ion source, which is then provided to a magnet system for mass analysis. The resulting mass analyzed ion beam has substantially the same transverse width, height, and aspect ratio as the ribbon beam from the ion source.

The magnet system provides one to one imaging of the source ions of a desired mass onto the target wafer, thereby facilitating control of process parameters such as dose uniformity and implant angular integrity. The invention may be advantageously employed in providing ribbon beams having transverse widths of about 400 mm or more (e.g., 550 mm) with uniform density profiles, whereby single-scan implantation of large wafers (e.g., 300 mm or 450 mm) can be achieved. In addition, the invention provides a relatively large ion beam cross-section throughout most of the magnet system, and the space charge is diffused, which is highly conducive to maintaining beam integrity in low energy implantation applications. Another advantage of the magnet system is that the total path length or travel distance of ions from the source to the target is nearly constant for all portions of the ribbon beam. In addition, the orbits of each individual ion are nearly identical to each other for all portions of the ribbon beam. Consequently, transport losses are uniform across the beam, and hence do not adversely impact implantation uniformity. Moreover, the architecture of the invention helps in preventing contaminants and particles from the source and the beam dumps from reaching the target wafer.

One aspect of the present invention provides a single dipole magnet which mass analyzes the ribbon shaped ion beam. The short axis of the ribbon beam is aligned to the magnetic field of the magnet. The long axis of the ribbon beam lies on the bending plane. The magnet bends the ribbon beam through an angle between 90 degrees and 200 degrees. But a bending angle of 180 degrees is the preferred bending angle. The dipole magnet comprises mainly two planner magnet poles, two planner coils and a return yoke to connect the two planner magnet poles. The magnet is in mirror symmetry to its mid-plane with one magnet pole and one coil on each side.

The internal spatial region between the two magnet poles serves as a spatial passageway for the traveling of ion beam.

According to another aspect of the invention, the magnet pole comprises the first half pole and the second half pole. The first half pole and the second half pole are in general connected together. In one fashion of the design, the first half pole and the second half pole are the same size and symmetric to their connection surface; In another fashion of the design, the first half pole and the second half pole are not the same size and asymmetric to their connection surface. For the preferred bending angle of 180 degrees, the two half poles are symmetric to their connection surface. For the other angles, the two half poles are in general not the same and are asymmetric to their connection surface. The coil is wound around the magnet pole, and the path of the coil mainly follows the boundary of the magnet pole.

According to another aspect of the invention, the ribbon beam comes in from one side of the first half pole; the output ribbon beam comes out from one side of the second half pole.

According to another aspect of the invention, the field clamps are connected to the magnet poles and partially surround the coil to reduce the extension of the fringe field which caused by the coil's electrical current. This feature will eliminate the bad effects of the magnetic field from the other systems near the magnet, for example, the ion source.

According to another aspect of the invention, the magnet pole surface has been shaped to provide either a constant field or non-constant field inside the magnet. The constant field will guide the ions go through curved orbits with constant radius, and the non-constant field will guide the ions go through curved orbits with varied radius. For the preferred 180 degree bending magnet, the constant field will guide the ions go through a half circular orbits, and the non-constant field will guide the ions go through a half elliptical-alike orbits.

According to another aspect of the invention, the first half of the magnet provides focusing in the direction in which the beam is bent. As a result, the ribbon beam will be focused to a tight focal spot at or near the connection surface of the first half pole and the second half pole and near the top of the bending beam orbits. Different from any other mass analyzing magnets, this magnet has its focal point inside the magnet itself. A resolving aperture can be provided at the focal point, so as to selectively pass only ions of the desired mass to the second half of the magnet. The second half of the magnet provides the similar focusing (or defocusing for easy understanding) in the direction which the beam is bent. As a result, the beam out of the mass resolving aperture will be expanded to form a ribbon beam at the exit of the magnet. This output ribbon beam is in general the one-to-one image transformation of the input ribbon beam.

Additional aspects of the invention provide the methods to increase the mass resolving power of the magnet. The magnet pole surface can be shaped to provide non-constant field distribution inside the magnet. Since the magnetic field is not constant, the curvature of the beam orbit varies along its length. This non-constant field distribution can reduce the focal spot size and increase the dispersion. As a result, the mass resoling power can be increased. The entrance edge of the first half pole and the exit edge of the second half pole can be curved to further reduce the focal spot size, so as to minimize distortions and aberrations in the shape of the ion beam.

Another aspect of the invention is that the magnet pole surface can be shaped to provide focusing in the direction of the magnetic field which is the direction of the short axis of the ribbon beam. As a result, the magnet has a large acceptance in this direction and the ion beam leaving the magnet is focused to a line focus of a high aspect ratio.

According to another aspect of the invention, the shape of the magnet pole can be trimmed according to the envelope of the ribbon beam orbits. This can largely reduce the overall magnet weight and the total power consumption. The coil will be wound around the shape of the magnet pole.

Ion implantation systems therefore are provided with a mass analyzed ribbon beam for use in implanting workpieces.

One aspect of the present invention is an ion implantation apparatus comprising of an ion source, an extraction assembly for extracting an ion beam through a parallel extraction-optics, a mass analyzer magnet, and a beam density controller. The implantation apparatus further includes a target chamber in which is mounted a target for implantation. Illustratively, the target is a semiconductor wafer or flat panel display. From the ion source and the extraction optics, a parallel ribbon beam is formed. The longer transverse dimension of the ribbon beam is located in the bending plane of the magnet. This long transverse dimension of the ribbon is wider than that of the target. The magnet is the invented magnet mentioned above, and the preferred bending angle is 180 degrees. The mass analyzer magnet receives the ribbon beam and focuses the beam into a narrow slit that corresponds to a resolving aperture inside the magnet. Ions having different masses are thus blocked by the aperture, thereby providing ions of only a desired mass. The desired ions comes out of resolving aperture, then expands to form a ribbon beam again, and comes out of the magnet. As the beam continues to travel downstream, the beam continues to keep its ribbon shape such that when the ion beam reaches the target wafer, it has the sufficient width to cover the entire diameter of the wafer. The target is then translated through this ion beam along a single path, one or more times, to implant a desired uniform dose of ions into its surface. The apparatus for ion implantation further includes a Faraday beam current measurement device disposed in proximity to the target wafer for scanning across the longer transverse dimension of the ion beam to measure the beam uniformity and to provide the measurement data back to the beam density controller.

According to one aspect of the invention, the mass analyzer magnet can have the bending angle of either the preferred 180 degree or the non-180 degree. For the case of 180 degree bending angle, the ion source and the target chamber are set up parallel to the magnet. The ribbon beam comes out of the ion source goes normally into the magnet, and the output ribbon beam comes normally out of the magnet. For the case of non-180 degree bending angle, the ion source and the target chamber are set up with angles to the magnet. The ribbon beam comes out of the ion source goes into the magnet with an angle, and the output ribbon beam comes out of the magnet with another angle to the magnet.

The ion implantation apparatus further includes a beamguide defining a beam cavity through which the ion beam travels from an entrance end to an exit end in the environment of high vacuum.

A further aspect of the invention is that the system can contain one or two beam angle and beam uniformity correction units. The first angle and uniformity correction unit can be put in between the ion source and the entrance of the magnet, and the second angle and uniformity correction unit can be put in between the exit of the magnet and the end station.

The system can then include an optional means of deceleration of the ion beam using a so called deflecting decel unit to deliver high beam currents at low energies while filtering out high-energy contaminants. The low energies beams are for example the Boron beam from 0.1 KeV to 5 KeV. The decel unit can be put in between the analyzer magnet and the target chamber.

The disclosed invention makes it possible to:
(1) Generate a ribbon beam for ion implantation which is mass-analyzed efficiently with a single analyzing magnet in a short, relatively simple beamline with high resolving power and almost zero system aberration;
(2) Improve the quality of the decelerated ion beam because of the small aberration of the magnet;
(3) Control the collimation of the ion beam and control variation in implantation angle over the surface of the target;

Another ion implantation systems are provided with a mass analyzed ribbon beam for use in implanting workpieces, the width of the ribbon beam can be adjusted to be either wider or narrower than that of the workpieces. Also, the implanter system is able to make switches between the wider beam and the narrower beam.

The system includes angle devices to adjust the width of the ribbon.

By implementing the system design and configuration of this invention, equipment suppliers can meet the challenge of making a serial machine for implantation applications that is reliable and has competitive process control capability. Furthermore, the novel system configuration in this invention involves relatively few components and has much less system aberrations compared to other serial high current methods. This invention provides a superior product to the semiconductor industry, especially for low energy, 300 mm applications and future 450 mm applications.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
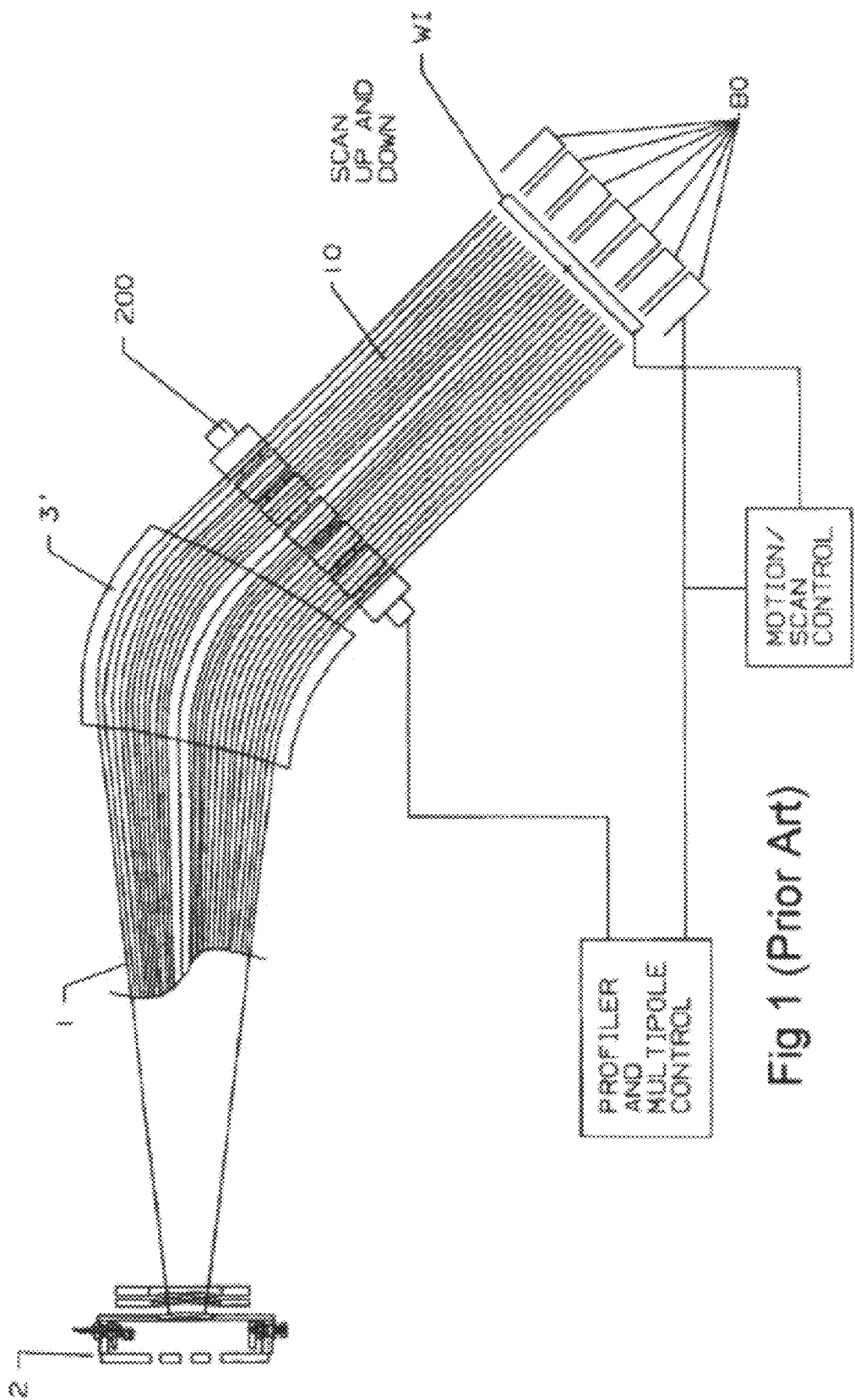
FIG. 1 is reproduced from U.S. Pat. No. 5,834,786 and shows a prior art single magnet ribbon beam implanter having a resolving power of about 2.

The present invention will now be described with reference to the drawings wherein like reference numerals are used to refer to like elements throughout. The invention provides methods and systems for the provision of a mass analyzed ribbon-beam for ion implantation of workpieces such as semiconductor wafers. One implementation of the invention is illustrated and described hereinafter with respect to the drawing figures. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

I. The Technical Underpinnings of the Present Invention

A. The Conventional Mass Analyzing Magnet

Figure 7A:
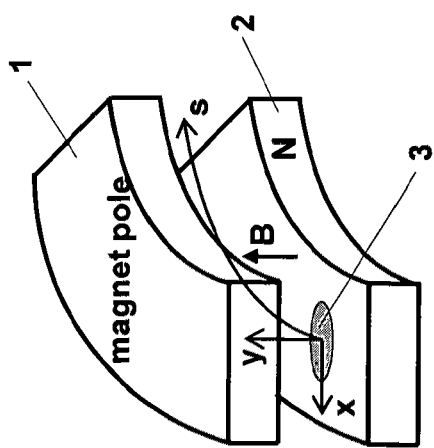
FIG. 7a illustrates a schematic of the conventional sector magnet.

For conventional mass analyzer magnet, it is the sector magnets that perform mass analysis. FIG. 7a shows a sector magnet and the ion beam inside. The magnetic field is produced in the space between the two magnet poles 1 and 2. An ion beam 3, usually circular or elliptical, is produced and sent into the magnet.

In a uniform magnetic field, ions with different masses will move in circular orbits with different radii, $$r = \frac{mv}{qB} \quad (1)$$

Where r is the radius of circular moving orbit, m is the mass of the ion, q is the charge state of the ion, V is the moving speed of the ion, and B is the magnetic field strength. As a result, unwanted ions may be captured either by the vacuum chamber or by the mass resolving aperture and the desired ions will transmit down the beam line.

Figure 7B:
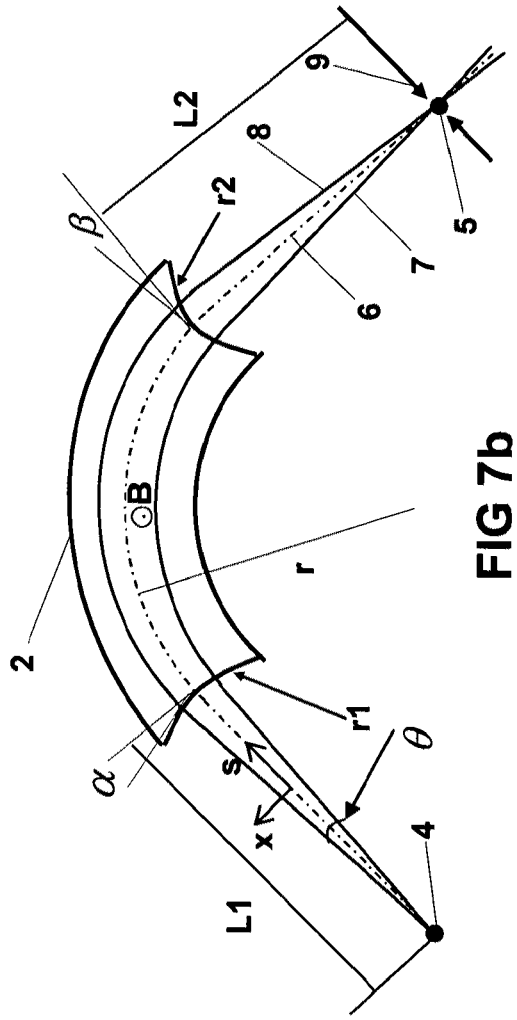
FIG. 7b illustrates a schematic of the conventional mass analyzer magnet working in the regime of point-to-point transmission.

FIG. 7b shows the typical optics, strictly, point-to-point transmission of a mass analysis system consisted of a sector magnet. FIG. 7b shows the typical optics, strictly, parallel-to-point transmission of a mass analysis system consisted of a sector magnet.

The entrance end edge and the exit end edge of magnet poles 1 and 2 can be shaped with small angles of α and β, respectively. The central orbit of the system is labeled 6. Labels 7 and 8 represent two typical moving trajectories of ions. They usually start from the object point 4 of the system. An ion source is usually located near the object point 4. The image point of the system is labeled 5 close to which the mass resolving aperture 9 is usually setup. The coordinate system (x,y,s) for describing the magnet and the motion of ion beams is also shown in FIG. 7a and FIG. 7b. Where x and y are normal horizontal and vertical coordinates, s is set along the central orbit 6. In order to increase the mass resolving power of the magnet system, the drift space of L1 (the spacing between the object point 4 and the magnet entrance), the drift space L2 (the spacing between the magnet exit to the image point 5), and the magnet radius r and its bending angle are designed to give the maximum dispersion. In order to reduce aberration, the magnet pole's entrance face and exit face are designed with radius of r1 and r2, respectively.

The method to describe optical properties of ion beam transportation systems is the so-called transfer matrix. In the coordinate system of (x,y,s), the beam optics of mass analysis system in the bending plane (x,s) is as below, $$\begin{pmatrix} x_1 \\ x'_1 \\ \Delta p/p \end{pmatrix} = \begin{pmatrix} M_{11} & M_{12} & M_{13} \\ M_{21} & M_{22} & M_{23} \\ 0 & 0 & 1 \end{pmatrix} \begin{pmatrix} x_0 \\ x'_0 \\ \Delta p/p \end{pmatrix} \quad (2)$$

Where x is half of the full beam dimension in the bending plane, x' is the beam divergence, and Δp/p is the beam momentum divergence. The footnotes 0 and 1 indicate the values at positions of object and image, respectively. The dispersion of the system is $$D = M_{13} \Delta p/p \quad (3)$$

The well-designed mass analysis system should give a large $M_{13}$ for a large mass resolving power.

Where $M_{13}$ is mainly determined by the sector magnet. For ion beams, very precisely, $$\Delta m/m = 2\Delta p/p \quad (4)$$

The mass resolving power is generally defined as $$m/\Delta m = \frac{M_{13}}{2(a+b)} \Delta p/p \quad (5)$$

Where Δp/p usually takes the value of 1%, a is the half of the full aperture width and b is the half of the full beam size at the image or at the position of mass resolving aperture, $$b = M_{11}x_0 + M_{12}x'_0 \quad (6)$$

Well-designed mass analysis system should give a large $M_{13}$ for a large mass resolving power. But on the other hand, mass resolving power will be affected by the beam size at the position of mass resolving aperture. Usually, the optics from the object to the image is designed either as the so-called point-to-point transmission or the so-called parallel-to-point transmission. The ideal point-to-point transmission, see FIG. 7b, meets, $$M_{12} = 0$$

$$b = M_{11}x_0 \quad (7)$$

Figure 2:
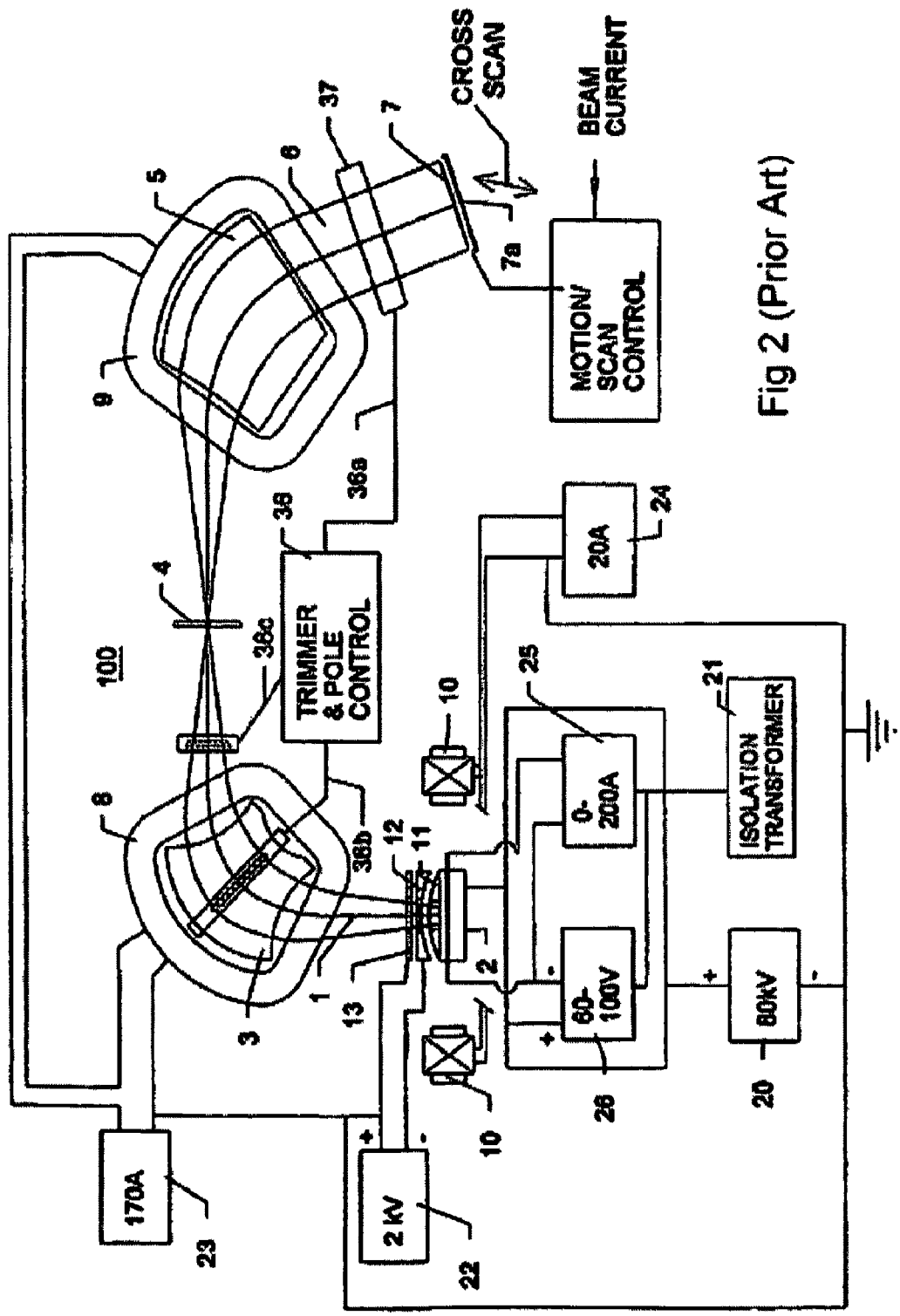
FIG. 2 is reproduced from U.S. Pat. No. 5,350,926 and shows a prior art two magnet system having a resolving power of about 60.
Figure 3A:
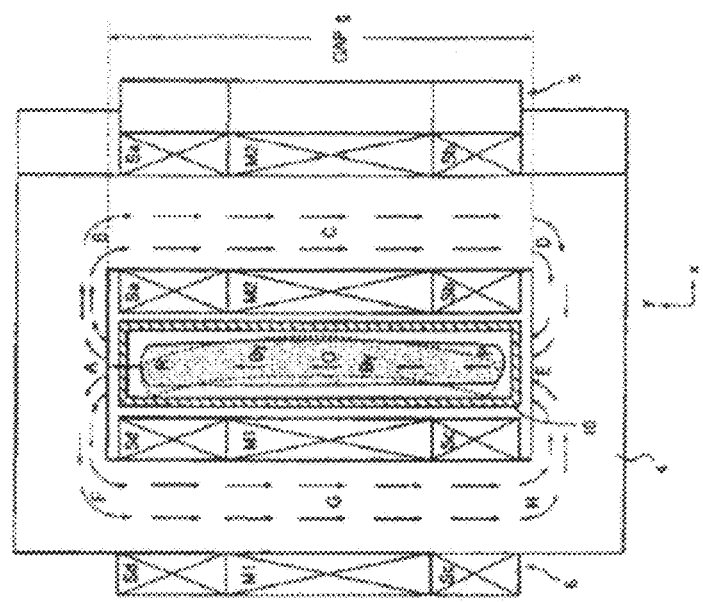
FIG. 3a is reproduced from U.S. Pat. No. 6,160,262 and shows a top view of a prior art "window frame" magnet ribbon beam system having a large pole gap and reasonable magnetic resolving power.
Figure 3B:
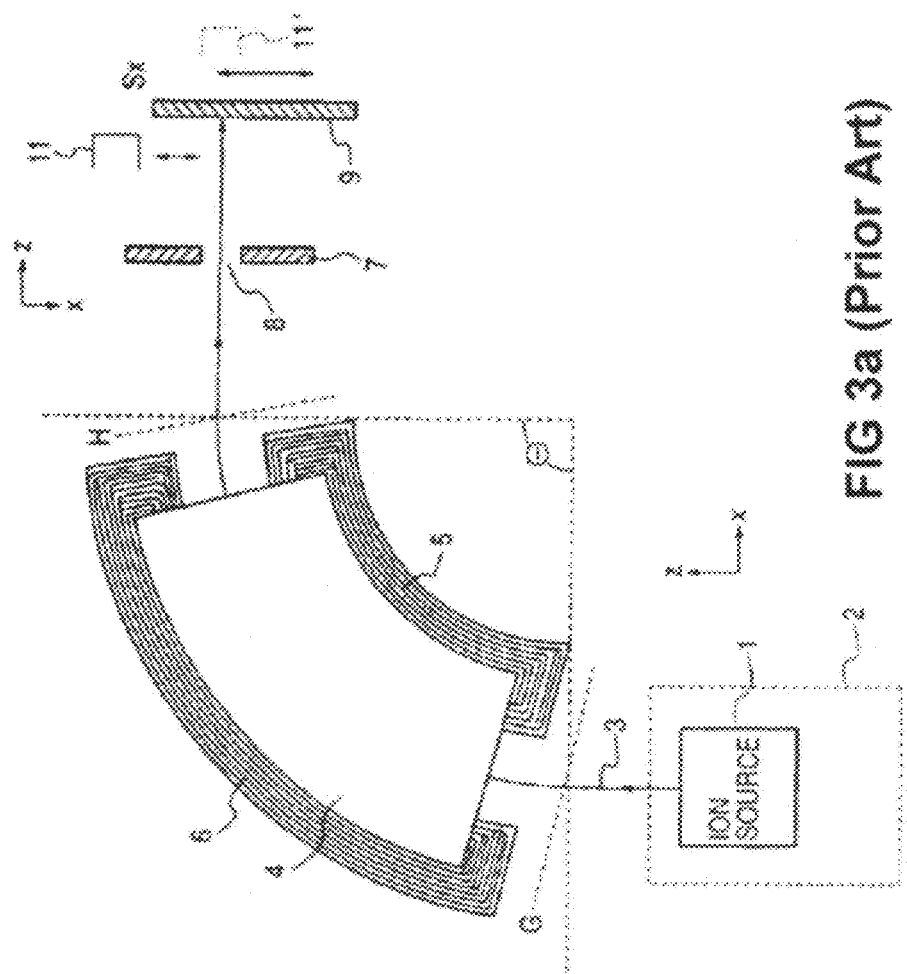
FIG. 3b is reproduced from U.S. Pat. No. 6,160,262 and shows a cross-sectional view of a prior art "window frame" magnet, as seen along the direction of the beam.
Figure 4:
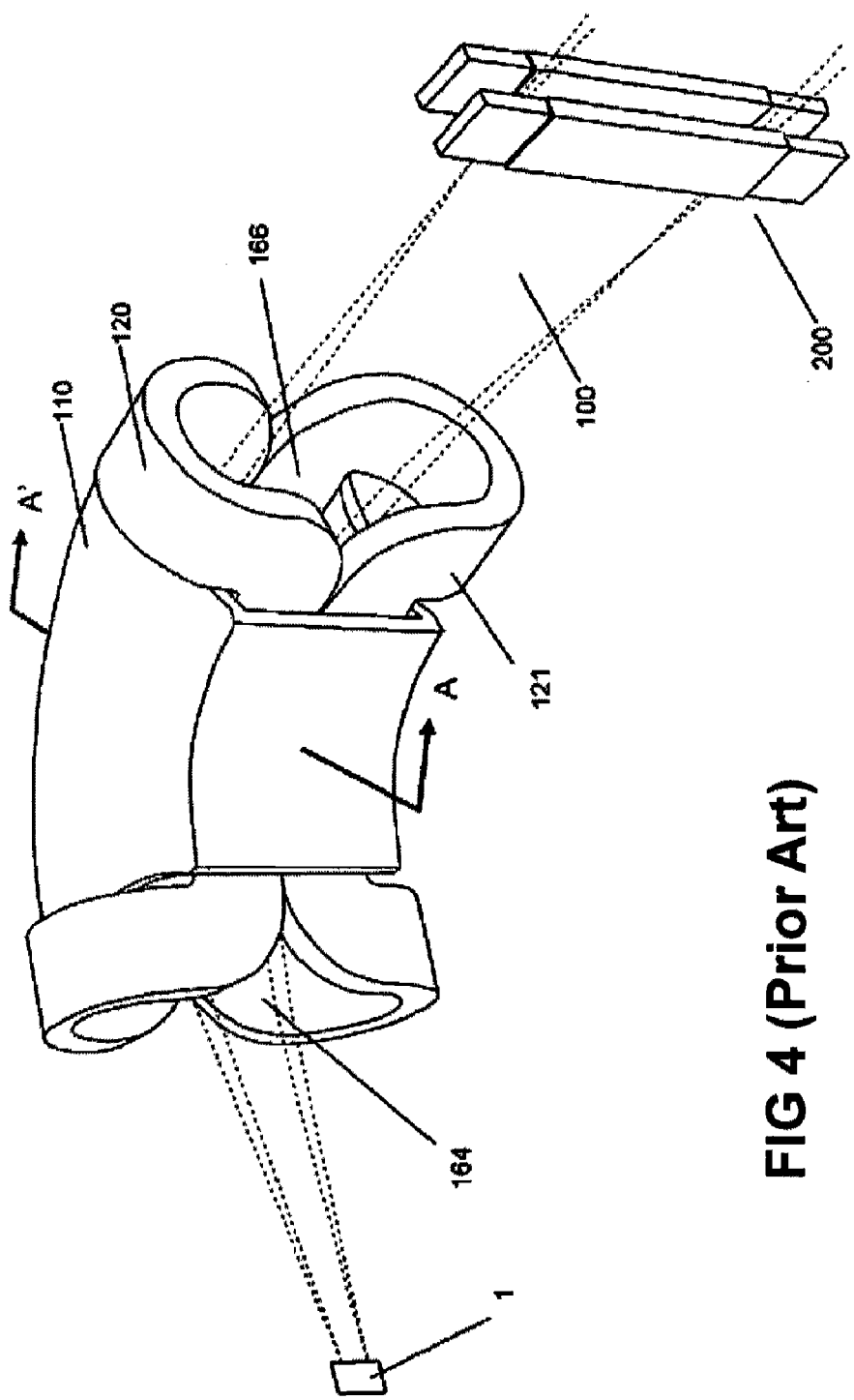
FIG. 4 is reproduced from U.S. Pat. No. 7,112,789 and shows a perspective view of a prior art "window frame" magnet with "bedstead" coil having high resolving power and using an open Panofsky quadrupole lens to create a tall parallel beam.
Figure 5B:
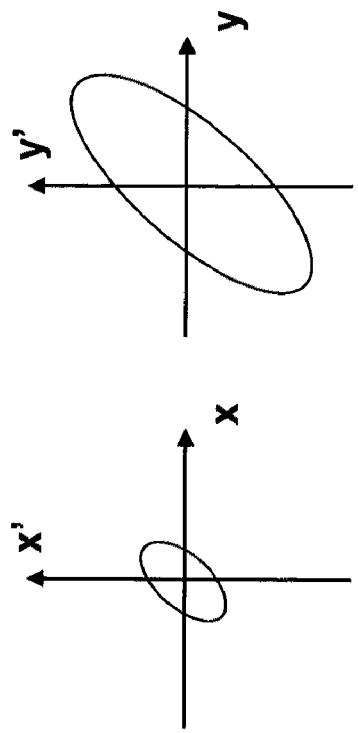
FIG. 5b illustrates the emittance plots of a beamlet in x-x' and y-y' space.
Figure 5A:
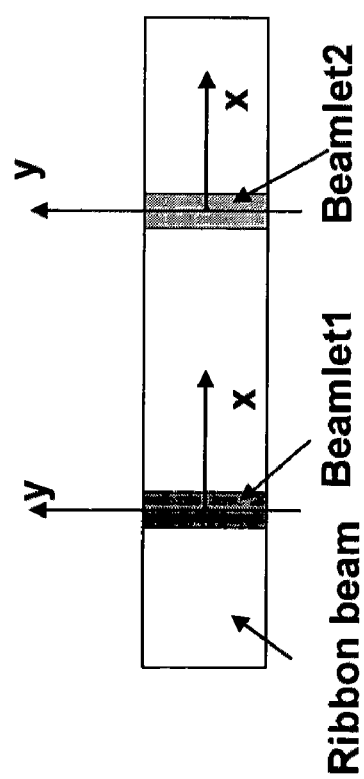
FIG. 5a illustrates two beamlets at the different positions of the ribbon beam.
Figure 7C:
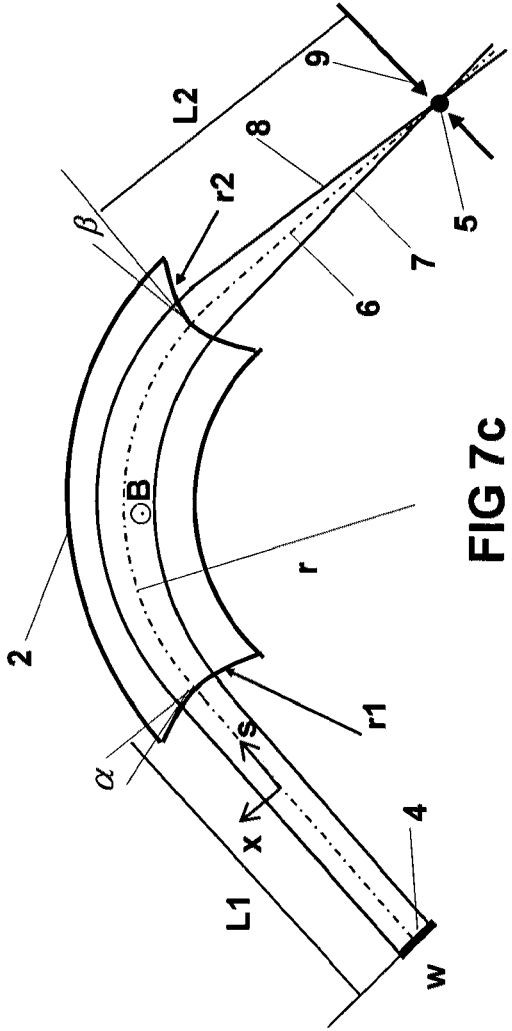
FIG. 7c illustrates a schematic of conventional mass analyzer magnet working in the regime of parallel-to-point transmission.

The first magnet in the prior art FIG. 2 works in this point-to-point transmission regime. The ideal parallel-to-point transmission, see FIG. 7c, meets, $$M_{11} = 0$$

$$(8) \quad b = M_{12}x'_0$$

Figure 6:
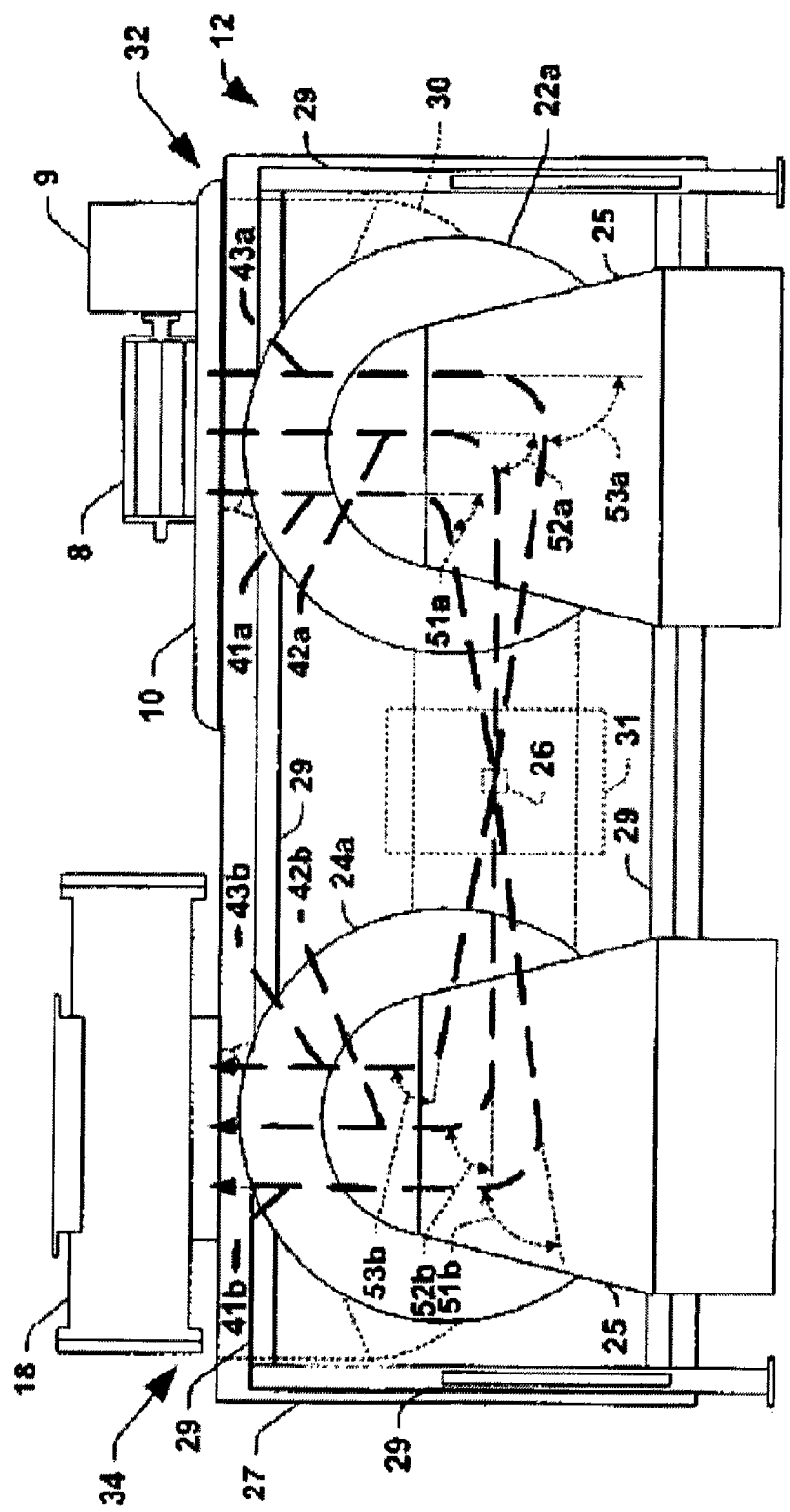
FIG. 6 is reproduced from U.S. Pat. No. 6,885,014 and shows a top view of a prior art two magnet system having high resolving power, The system is featured with using a ribbon ion source to provide parallel ribbon ion beam as the input beam.

The first magnet in the prior art of FIG. 6 works in this parallel-to-point transmission regime.

The conventional mass analyzing magnet features a focal point of image 5 which is located outside of the magnet. This focal point is necessary for mass analysis. However, in order to make a ribbon beam, the second magnet is required to transform the beam from a focal point to a parallel ribbon beam. This is what have been done in the prior art of FIG. 2 and FIG. 6. Such an arrangement is the so called dual magnet system.

The conventional mass analyzing magnet also features large aberrations for large beams. For point-to-point transmission in FIG. 7b, the aberrations increase with beam divergence angle θ. For parallel-to-point transmission in FIG. 7c, the aberrations increase with beam width w. The large aberration will cause higher beam density variation along the long axis of the ribbon beam.

Accordingly, it would be desirable to develop a magnet that can replace the conventional mass analyzer magnet and can provide large mass resolving power and less aberration for ribbon beams. If so, such a magnet would take a significant role in making ribbon beam ion implanters.

B. The Invented Mass Analyzer Magnet

Figure 8:
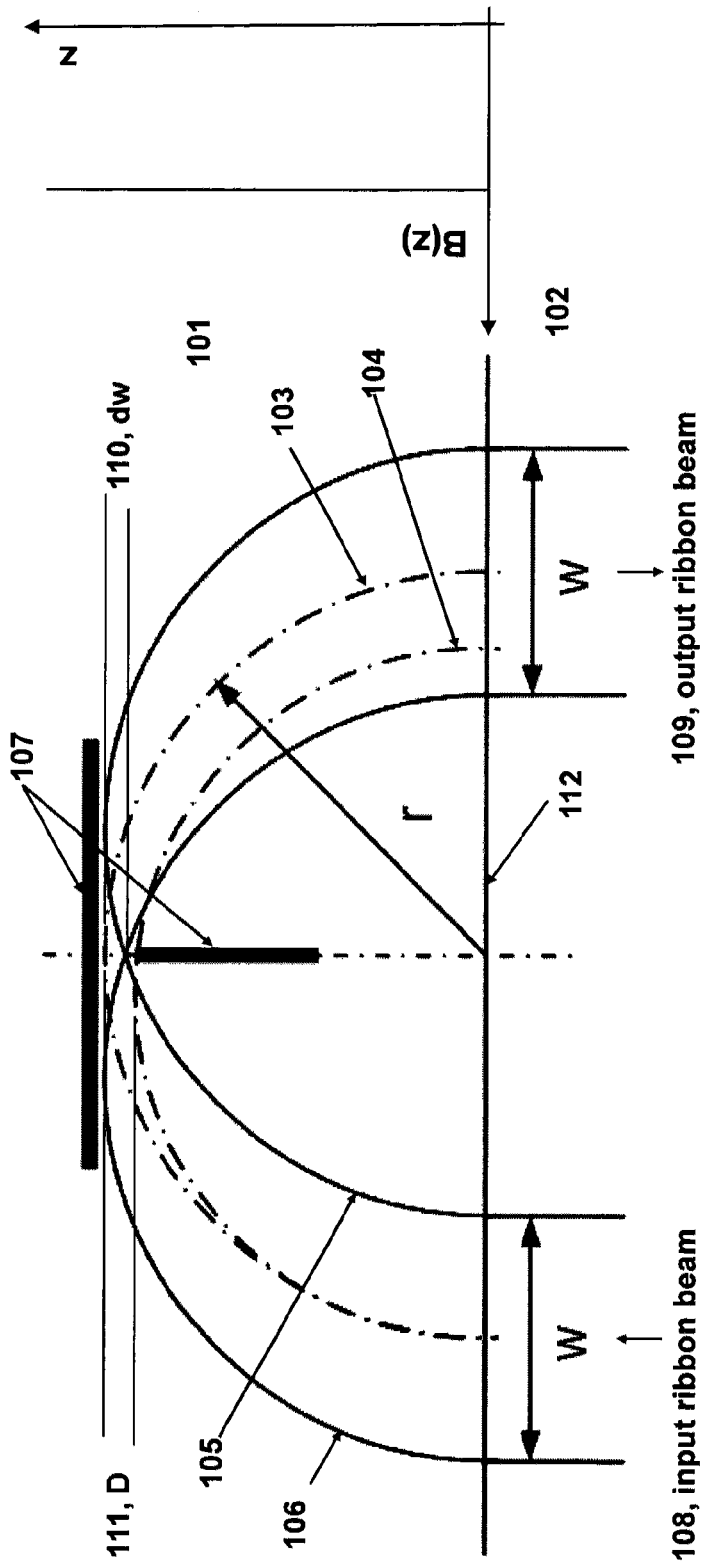
FIG. 8 illustrates the concept of the invented 180 degree magnet. The magnetic field is a constant field. The ions go through circular alike orbit.

The concept of the invented mass analyzer magnet for ribbon beam is showed in FIG. 8. An ion of 103 starts from zero field region 102 and goes into the constant magnetic field region 101. The boundary of the magnetic field region is 112. The ion 103 goes into the field region with an angle perpendicular to the field boundary of 112. The ion 103 will move along a circular orbit with radius of r according to (1). The ion 103 will make a semicircle and come out to the zero field region of 102. The ion 103 is bent by exactly 180 degrees. Similarly, a parallel input ribbon beam 108 with boundary ions of 105 and 106 goes into the field region 101, the boundary 105 and 106 are symmetric to the ribbon beam's center of 103. All the ions in the ribbon beam will go through similar circular orbit with the same radius r. The input parallel ribbon beam 108 will be bent by exactly 180 degrees to form an output parallel ribbon beam 109 at the exit. The output ribbon beam 109 is the one-to-one transformation of the input ribbon beam 108 in the direction of the long axis of the ribbon beam. If the input beam is parallel ribbon beam, the output will be parallel ribbon beam. There is no any aberration aroused from the magnetic field.

In the region near the middle of the ion orbit 103, the ribbon beam forms a tight spot dw 110. This geometric focal point size can be calculated based on the basic geometrics, $$dw = r - \sqrt{r^2 - \left(\frac{w}{2}\right)^2} \quad (9)$$

Where w is the width of the input ribbon beam. For the center ion with different mass of (m−dm), its orbit is 104. The dispersion D 111 is defined as the difference of the radii of the orbits of the ions with different masses. The D can be derived from (1), $$D = 0.5r\left(\frac{dm}{m}\right) \quad (10)$$

In order to be able to separate the ions with mass of m from the ions with mass of (m−dm), the dispersion D needs to be larger than the geometrical focal spot size dw. A resolving aperture 107 can be put in the middle of the magnet and near the position where the focal spot is formed. The opening of the resolving aperture can be set to be dw and be narrower than D. Thus, the ions with the mass out of the range (m±dm) would be blocked by the aperture 107.

Therefore, this 180 degrees magnet satisfies the fundamental requirement:
1) accepting the input ribbon
2) forming a focal point so that the mass analyzing of the ribbon beam can be done
3) after the mass analyzing, the ribbon beam is restored at the exit with ideally zero aberrations.

Different from the conventional mass analyzing magnet, this 180 degrees magnet features:
1) the geometrical focal point for the input ribbon beam is inside the magnet
2) all the ions of the ribbon beam see exactly the same magnetic field, their orbits are completely similar but with position shift according to the positions of the input ions.
3) there is no aberration caused by the magnet in the beam optics across the whole ribbon beam. This feature is extremely important for the downstream decel system to produce productive low energy ion beams.

Figure 9:
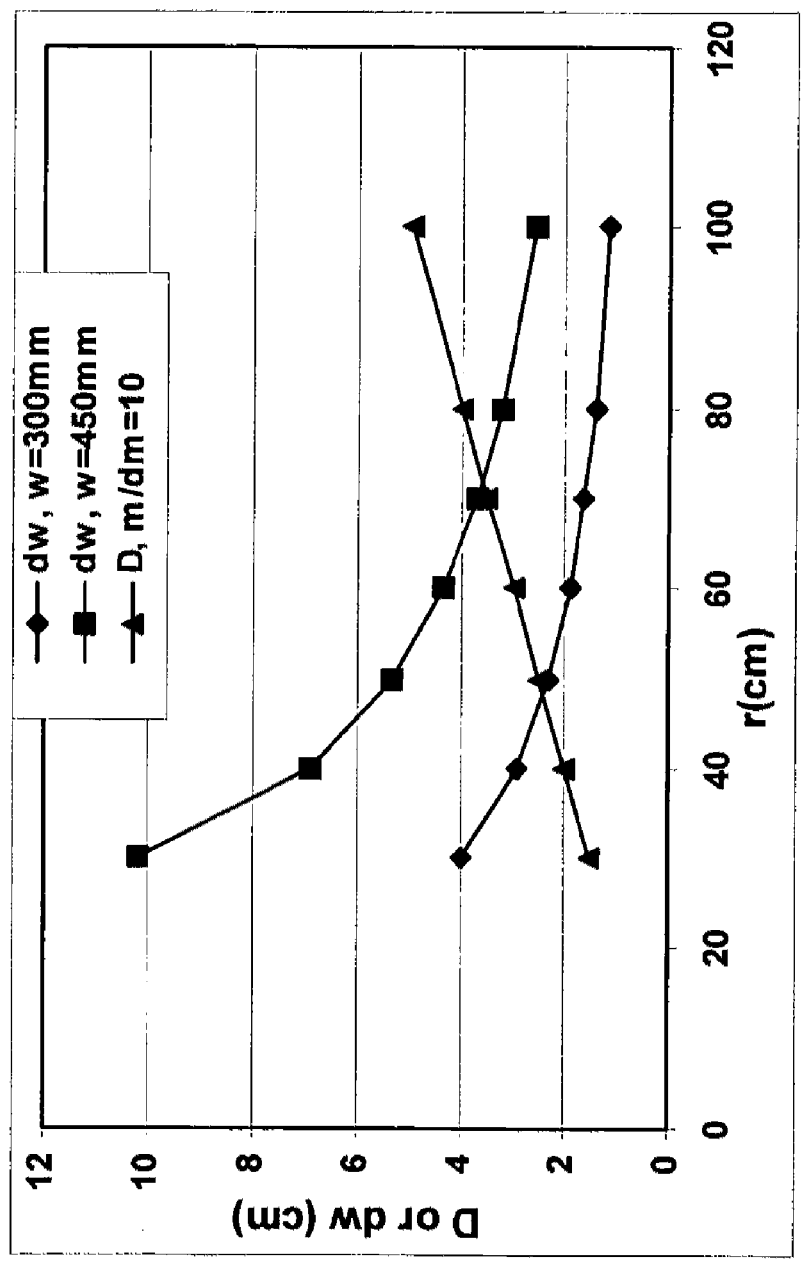
FIG. 9 is a diagram which shows the relation of dispersion D and the focal spot size dw with bending radius r and the ribbon beam width w for the magnet of FIG. 8.

FIG. 9 illustrates the relation of dispersion D and the focal spot size dw with bending radius r and the ribbon beam width w. The dispersion D is set with mass resolution power of 10. It is found that dw increases with w. In order to make this magnet mass analyzing wider ribbon beam, the bending radius r has to be increased. For very wide beam, it is obvious that the magnet needs to be very large. In reality, this would set the limitation to the application of this 180 degree magnet. Therefore, in order to make small size magnet to be able to do mass analyze for much wide ribbon beams, much more sophisticated design is required.

C. The Invented Technique Increases the Dispersion and Reduces the Focal Spot Size The mass resolving power can be increased if the dispersion D can be increased and/or the focal spot size dw can be reduced.

Figure 10:
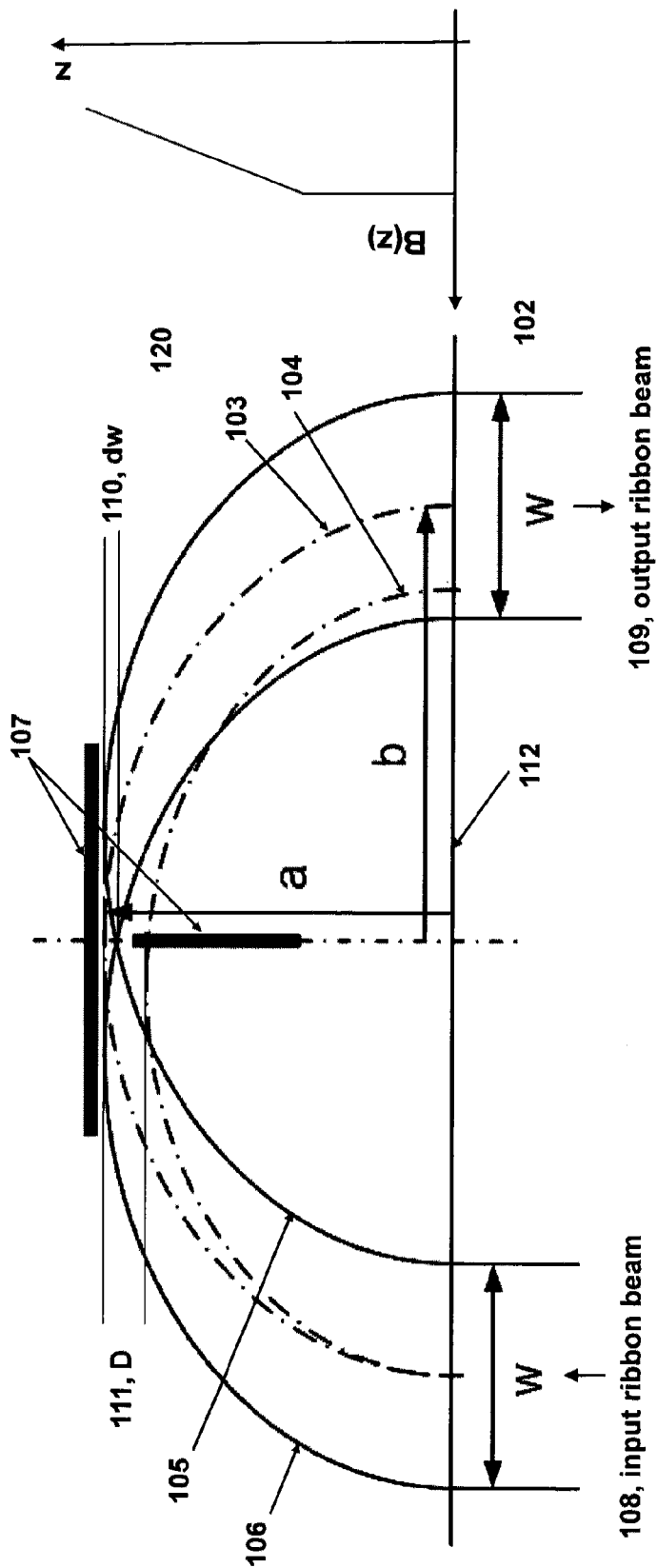
FIG. 10 illustrates the concept of the invented 180 degree magnet. The magnetic field strength is tapered along the z. The ions go through elliptical alike orbit.

FIG. 10 illustrates an invented technique to increase the mass resolving power. In the magnetic field region 120, the magnetic field strength can have a distribution along z. In this example, let B(z) be constant in the beginning, then gradually drop along z direction. The input ribbon beam 108 starts from zero field region 102 and goes into the magnetic field region 120. The boundary of the magnetic field region is 112. With such a field distribution B(z), the ions will go through elliptical-alike orbit.

The 103 is the orbit of the center ion with mass of m in the ribbon beam, 105 and 106 are the orbits of the boundary ions with mass of m. The other ions in the ribbon beam will all go through the similar elliptical-alike orbits. Those orbits are of the same shape with only the shift of position. The elliptical orbit is defined by two parameters: the long axis b and the short axis a. The input parallel ribbon beam 108 will be bend exactly 180 degrees to form an output parallel ribbon beam 109 at the exit. The output ribbon beam 109 is the one-to-one transformation of the input ribbon beam 108 in the direction of the longer dimension of the ribbon beam. If the input beam is a parallel ribbon beam, the output will be a parallel ribbon beam. There is no any aberration aroused from the magnetic field.

The feature of the elliptical orbit can be represented by the long axis b and the short axis a. The ratio of b/a is defined as the elongation factor. The b/a is mainly determined by the magnetic field distribution of B(z). By varying the field distribution B(z), the b/a can be adjusted. For practical reasons, the elongation factor b/a is typically between 1 and 3.

In the region near the middle of the ion orbit 103, the ribbon beam forms a tight spot dw 110, the geometrical focal spot size can be derived from geometry, $$dw = a - \sqrt{a^2 - \left(\frac{w}{2}\frac{a}{b}\right)^2} \quad (11)$$

Figure 11:
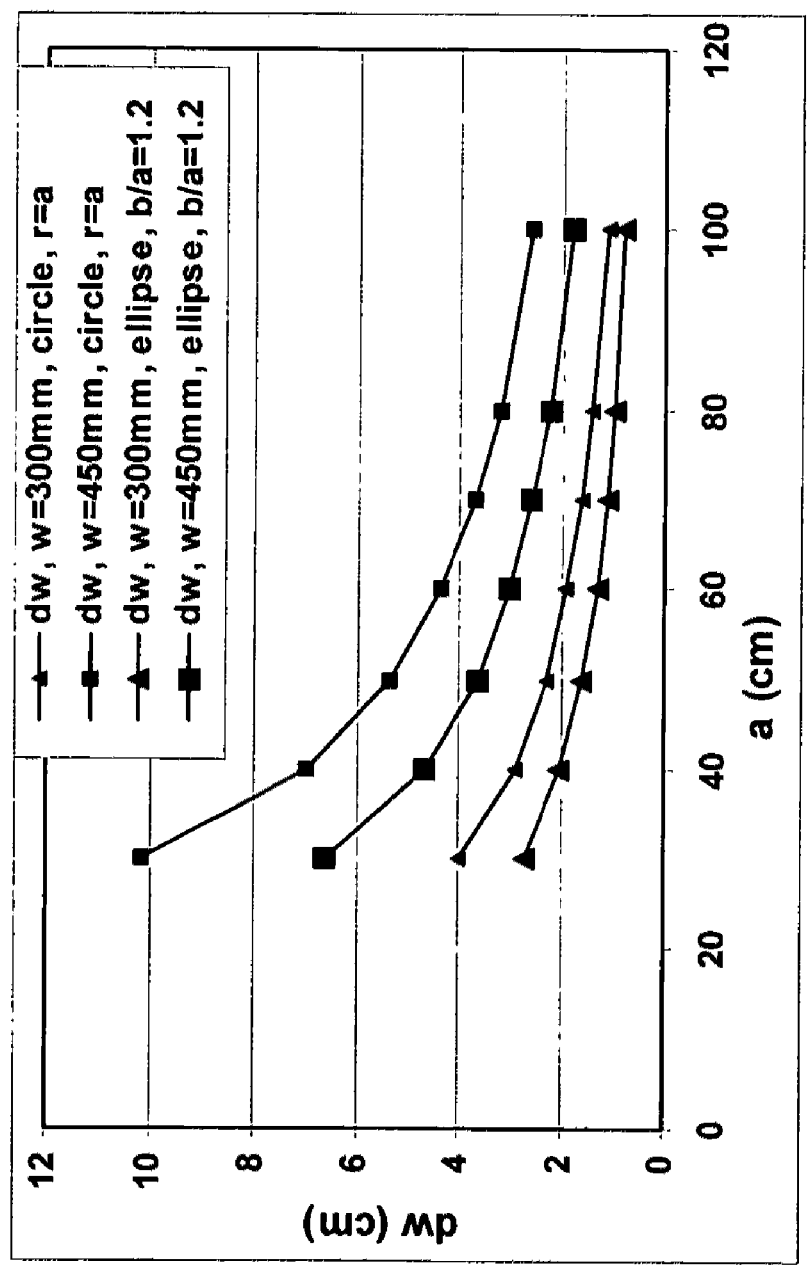
FIG. 11 is a diagram which shows the comparison of geometric focal point spot size dw for the circular orbit with radius a and the elliptical orbit with short axis of a and elongation factor of b/a=1.2.

The elliptical orbit determined by the field distribution B(z) can greatly reduce the geometrical focal spot size. FIG. 11 shows the comparison of geometrical focal spot size dw for the circular orbit with radius r=a and the elliptical orbit with short axis of a and elongation factor of b/a=1.2. Clearly, the dw is greatly reduced for elliptical orbits. The reduction factor is about 1.5 for b/a=1.2, about 2 for b/a=1.4. The reduction factor varies inversely with a.

The elliptical orbit determined by the field distribution B(z) can greatly increase the dispersion, too. For understanding purpose, the underline of the dispersion increment will be revealed. Because of the change of the magnetic field, the bending radius of the orbit at the entrance is different from that in the region of the mass resolving aperture 107. The bending radius in the region of the mass resolving aperture 107 can be calculated, $$r = a\left(\frac{b}{a}\right)^2 \quad (12)$$

The dispersion will be, $$D = 0.5a\left(\frac{dm}{m}\right)\left(\frac{b}{a}\right)^2 \quad (13)$$

For an example design of b/a=1.2, the total dispersion increment factor is about 1.44. For a large reduction of dw and large increment of D, one can make the orbit with larger elongation factor of b/a.

Figure 12:
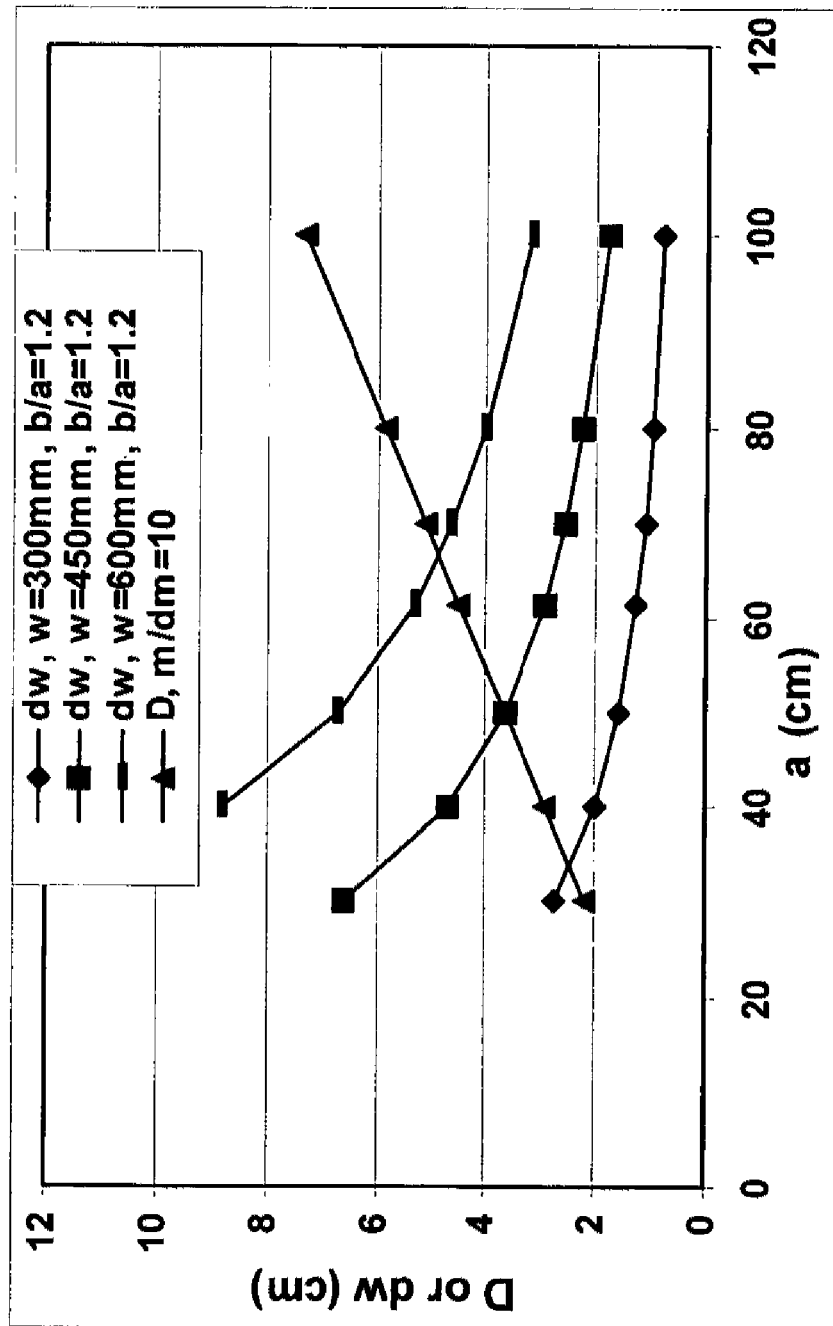
FIG. 12 is a diagram which shows the relation of dispersion D and the focal spot size dw for an example design with the short axis of a and elongation factor of b/a=1.2 and the ribbon beam width w.

FIG. 12 shows the relation of dispersion D and the focal spot size dw for an example design with the short axis of a, the elongation factor of b/a=1.2, and the ribbon beam width w. Comparing this result to the result in FIG. 9, it is very clear that the dispersion D is much larger than the geometrical focal spot size dw for the magnet with the orbit elongation factor b/a than with the circular orbit. This improvement brings two important results to the magnet design:

1) The magnet size can be greatly reduced to achieve the same mass resolving power. For example, if the required mass resolving power is set to 10, for the design of b/a=1.2, for 300 mm wide ribbon beam, the required magnet feature dimension a can be reduced to 35 cm from 50 cm; for 450 mm wide ribbon beam, the required magnet feature dimension a can be reduced to 50 cm from 75 cm.
2) The mass resolving power can be greatly increased for the same size magnet. For example if let the magnet feature dimension a=60 cm, the mass resolving power can achieve 30 for b/a=1.2 while the mass resolving power is only 15 for b/a=1 (b/a=1 means circular orbit).

FIG. 12 also displays the feasibility for an even wider ribbon beam. For example, for a 600 mm wide ribbon beam, the magnet feature size a=70 cm to give mass resolving power of larger than 10. For an even wider ribbon beam of 1000 mm, a careful design with somewhat larger b/a can give a magnet with feature size of a=90 cm to meet the mass resolving power requirement. This magnet size is very reasonable compared to the ribbon beam width of 1000 mm.

The tapered magnetic field distribution B(z) also brings two other important features to the ion implanter design integrated with the invented magnet.

The first feature is that the spacing between the input ribbon beam and the output ribbon beam can be greatly increased. For the magnet feature dimension a, if the elongated orbit of b/a=1.2, the spacing can be increased from 2a to 2.4*a*. This increased spacing will give more space to the hardware surrounding the input beam and the output beam. In other words, the increased spacing gives more space to the ion source and the workpiece process chamber designs.

The second feature is that the tapered magnetic field B(z) also gives very needed optical focusing ability to the ribbon beam in the direction of the shorter dimension of the ribbon beam. This feature will be described in more detail by FIG. 22.

The tapered field distribution B(z), or in general, the varied field distribution B(z), can be realized by shaping the surface of the magnet pole, which will be explained in detailed by FIG. 16.

D. The Invented Technique to Further Reduce the Focal Point Spot Size

The mass resolving power can be further increased if the focal spot size dw can be further reduced.

Figure 13:
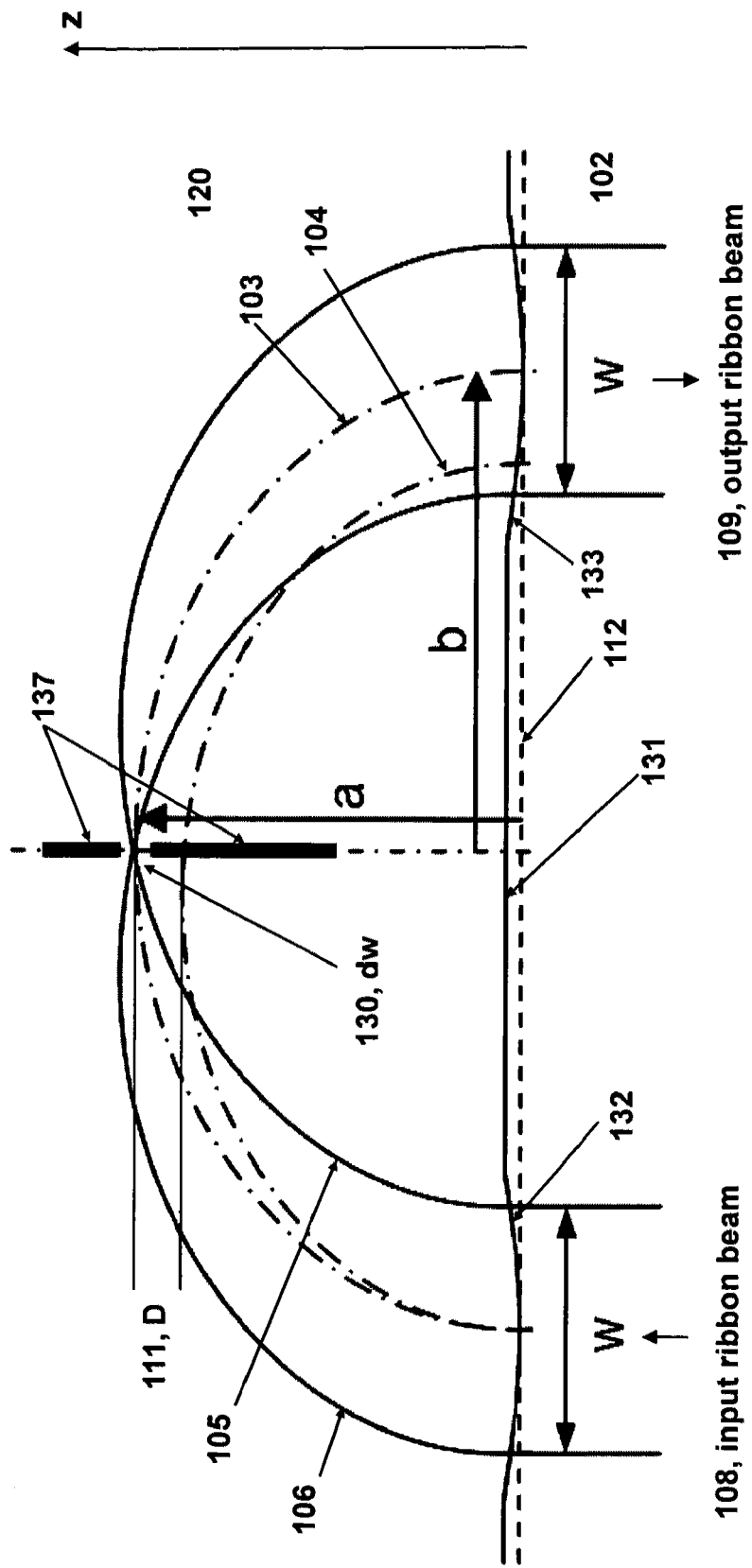
FIG. 13 illustrates the concept of the invented 180 degree magnet. The magnetic field strength is tapered along the z. The ions go through elliptical alike orbit. The magnetic field boundary has been tailored to reduce the focal point spot size.

FIG. 13 shows another invented technique to increase the mass resolving power. In the magnetic field region 120, the magnetic field strength can be varied along z. In this example, let B(z) be constant in the beginning, then gradually drop along z direction. The input ribbon beam 108 starts from zero field region 102 and goes into the magnetic field region 120. The boundary of the magnetic field region is 131. With such a field distribution B(z), the ions will go through elliptical-alike orbit.

The magnetic field boundary 131 is different from the straight field boundary 112 which has been shown in FIG. 10. The field boundary has been tailored locally. In this example design of FIG. 13, the field boundary at the entrance is a convex curve 132 around the center orbit 103 which is the orbit of the center ion of the ribbon beam 108; the field boundary at the exit is another convex curve 133 around the center orbit 103. The ion 103 will be bent by 180 degrees. The center orbit 103 is the same to the center orbit of 103 in FIG. 10. However, for the ions in the other positions of the ribbon beam, their orbits will be different from the orbits in the FIG. 10. For example, for the two boundary ions of 105 and 106, because of the tailoring of the field boundary, they will see the magnet field started at the slightly different position than that of the center ion 103. As a result, the orbits of the 105 and 106 will be shifted inward. From the geometric point of view, the ribbon beam will form a much tight focal point 130 at the position of the resolving aperture 137. The focal point size dw has been greatly reduced by this tailoring of the magnet field boundary.

After passing through the resolving aperture, the boundary ions of 105 and 106 will go through the whole magnet and be bent by 180 degrees. For the same reason, the ribbon beam with mass of m will be restored into a ribbon beam 109 at the magnet exit. The input parallel ribbon beam 108 will be bent 180 degrees to form an output parallel ribbon beam 109 at the exit. The output ribbon beam 109 is the one-to-one transformation of the input ribbon beam 108 in the direction of the longer dimension of the ribbon beam. If the input beam is a parallel ribbon beam, the output will also be a parallel ribbon beam.

Such kind of field boundary tailoring can be realized by shaping the entrance face and the exit face of the magnet pole, this will be explained in detail in the FIG. 18. This type of field boundary tailoring will increase the beam optics aberration. But since the tailoring is so small, the aberration will be very small.

E. The Invented Magnet with a General Bending Angle

The bending angle of 180 degrees is the preferred angle for this invented magnet design. However, depending on the system design specifications and system package requirement, the invented magnet can be designed with bending angle of 90 to 200 degrees.

In FIG. 10 where the bending angle is 180 degrees, the ribbon beam goes into and come out of the magnetic field region normal to the field boundary 112. This is defined as zero-degree of incident and exit angle.

Figure 14:
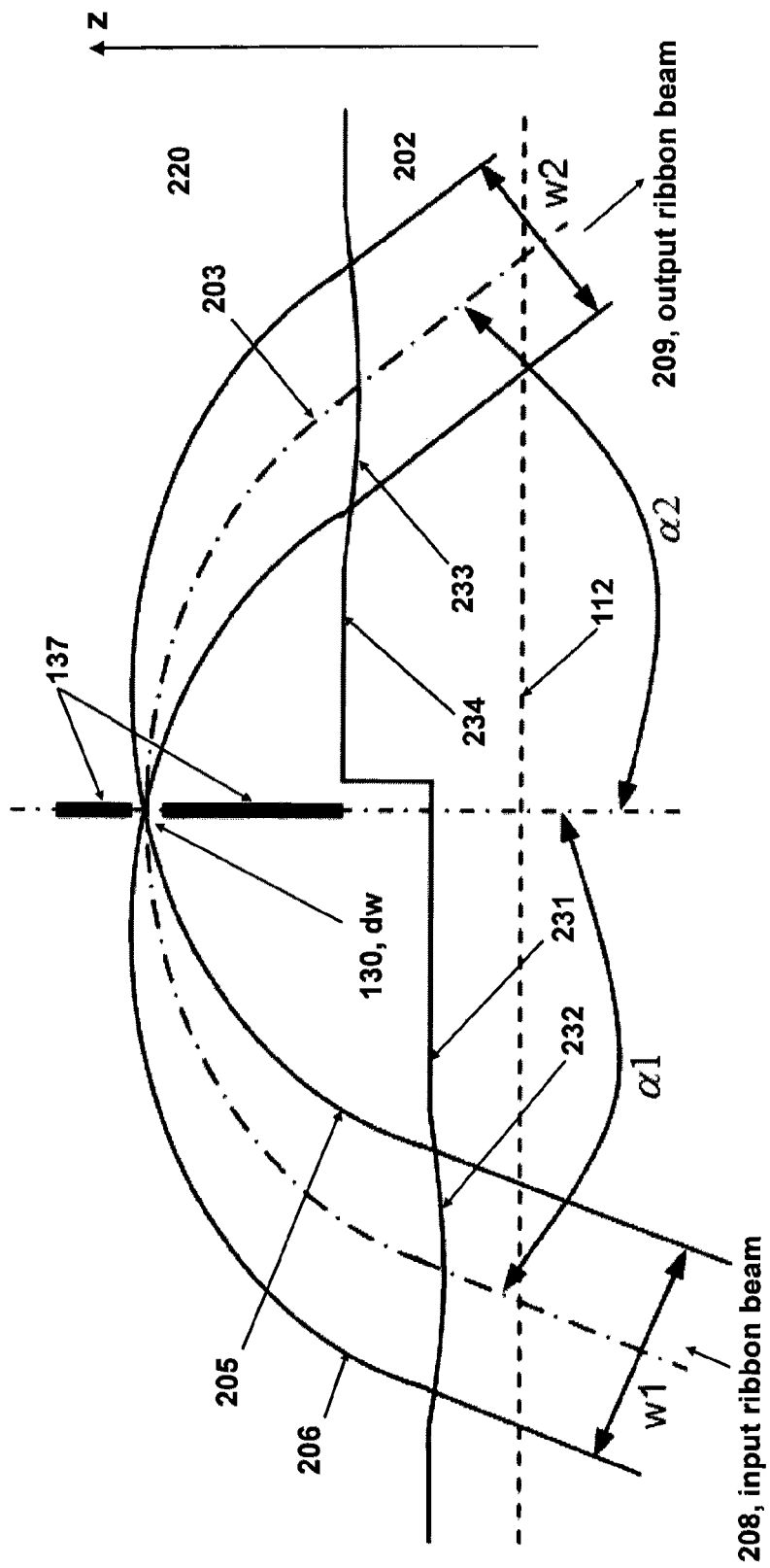
FIG. 14 illustrates the concept of the invented magnet with general bending angles of 90 to 200 degrees. The input ribbon beam will have an incident angle to the magnetic boundary, as does the output ribbon beam.

FIG. 14 illustrates the concept of the invented magnet with general bending angles of 90 to 180 degrees. In order to do so, some modifications need to be added. First, the original magnetic field boundary 112 will be pushed inward to the new field boundary 231. The boundary 231 is in general parallel to the original boundary 112. The input center ion 203 of the ribbon beam 208 will start from zero-field region 202, then will pass through the field boundary 231, then will go into the magnetic field region 220. Second, the input center ion 203 will have an incident angle of $\alpha 1$ to the normal direction of the field boundary of 231. The center ion 203 will be bent by the magnetic field and go through field boundary 234 into the zero-field region 202 as the output center ion. The output side field boundary 234 is in general parallel to the original field boundary 112. Depends on the position of the field boundary 234, the output center ion 203 will have an exit angle of $\alpha 2$ to the normal direction of the field boundary 234. The angle of $\alpha 1$ and $\alpha 2$ are defined as the beam incident angle and exit angle, respectively. The center ion 203 has been bent by $(180-\alpha 1-\alpha 2)$ degrees.

Such a left-right asymmetric field region can be realized by the left-right asymmetric magnet pole, which will be explained by FIG. 23.

As illustrated in FIG. 14, 203 is the orbit of the center ion with mass of m in the ribbon beam 208, 205 and 206 are the orbits of the boundary ions with mass of m in the ribbon beam 208. The orbit of 205 and 206 are similar to the orbit of 203, and they represent the beam shape of the ribbon beam inside the magnet. On the input side, the field boundary is 231; on the output side, the field boundary is 234. 231 and 234 are not necessary to be aligned on the same straight line, but they are parallel to the original field boundary 112. As a result, the incident angle $\alpha 1$ will not be the same to the exit angle of $\alpha 2$. In order to have a larger $\alpha 1$, the input side boundary 231 needs to be pushed inward, away from the original field boundary of 112. In order to have a larger $\alpha 2$, the output side boundary 234 needs to be pushed more inward away from the original field boundary of 112.

The input ribbon beam 208 will form a focal point 130 and will pass the mass resolving aperture 137. After passing through the resolving aperture 137, the ribbon beam with mass of m will be restored into a ribbon beam 209 at the exit. The input parallel ribbon beam 208 will be bent by $(180-\alpha 1-\alpha 2)$ degrees to form an output parallel ribbon beam 209 at the exit. If the input beam is a parallel ribbon beam, the output beam will be a parallel ribbon beam. Depending on the angle of $\alpha 1$ and $\alpha 2$, the output ribbon beam width w2 could be the same as or different from the input ribbon beam width w1.

Larger than 180 degrees bending angle can also be designed based on the same principle. In this case, the magnetic field boundary 112 will be pulled outward, and either or both angles of $\alpha 1$ and $\alpha 2$ will be set to negative values. However, the system package may not prefer the design with a larger than 180 degrees bending angle.

Therefore, in general, the values of $\alpha 1$, $\alpha 2$ are between 45 degrees to −45 degrees. The special case is $\alpha 1=\alpha 2=0$ for 180 degrees bending. For non-180 degree bending, depending on the package requirement, $\alpha 1$ and $\alpha 2$ can be set to equal or not equal.

The magnetic field distribution B(z), not shown in the FIG. 14, can be shaped to reduce the focal point size dw and to increase the dispersion D. As illustrated in FIG. 14, the field boundary 231 and 234 can be tailored locally with convex curve 232 and 233 around the center orbit 203. The focal point size can be reduced by this boundary tailoring.

II. Preferred Embodiments for the Present Invention of Magnet

Figure 15:
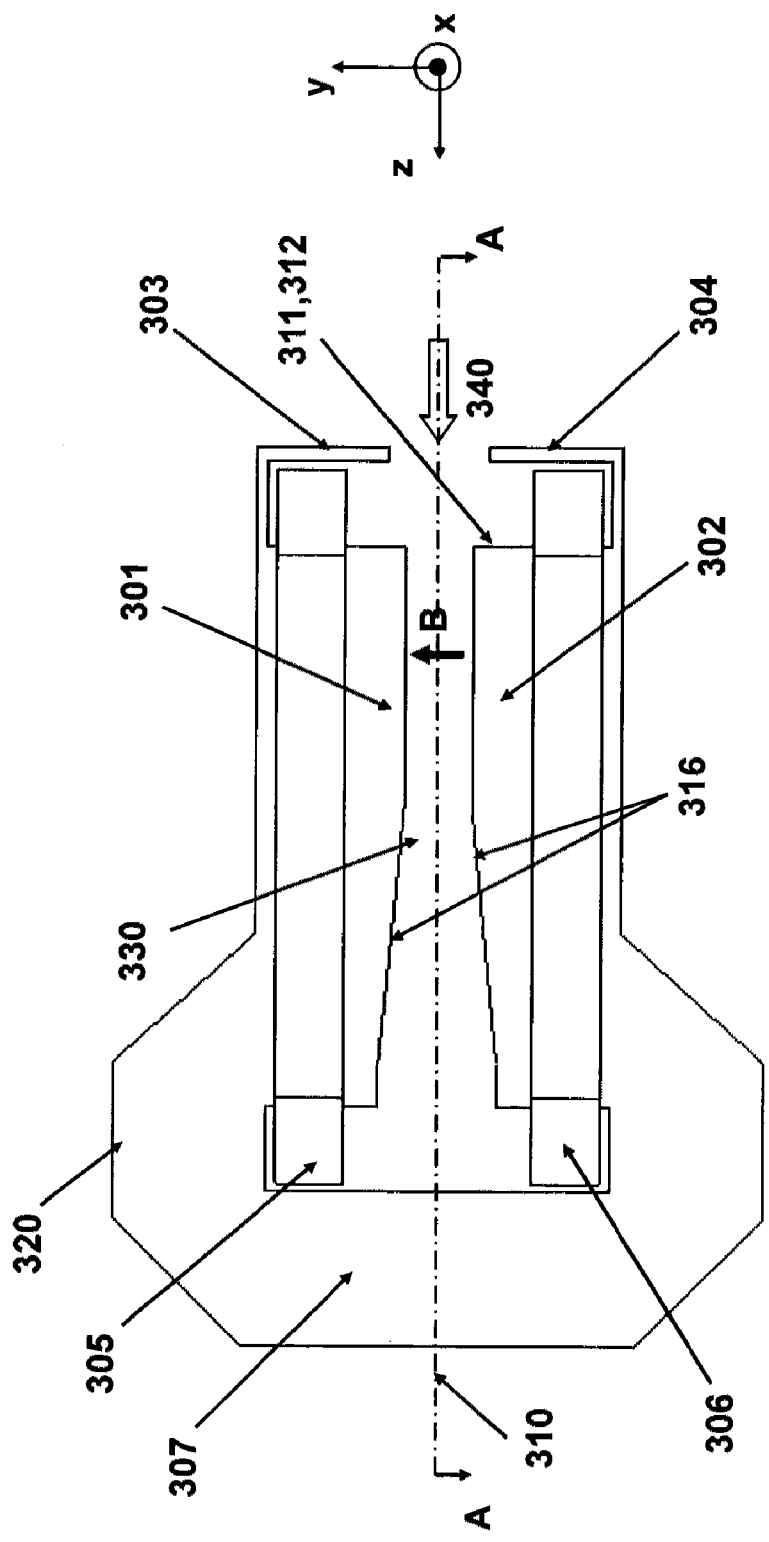
FIG. 15 illustrates a preferred embodiment of the present invented mass analyzer magnet in side view.
Figure 17:
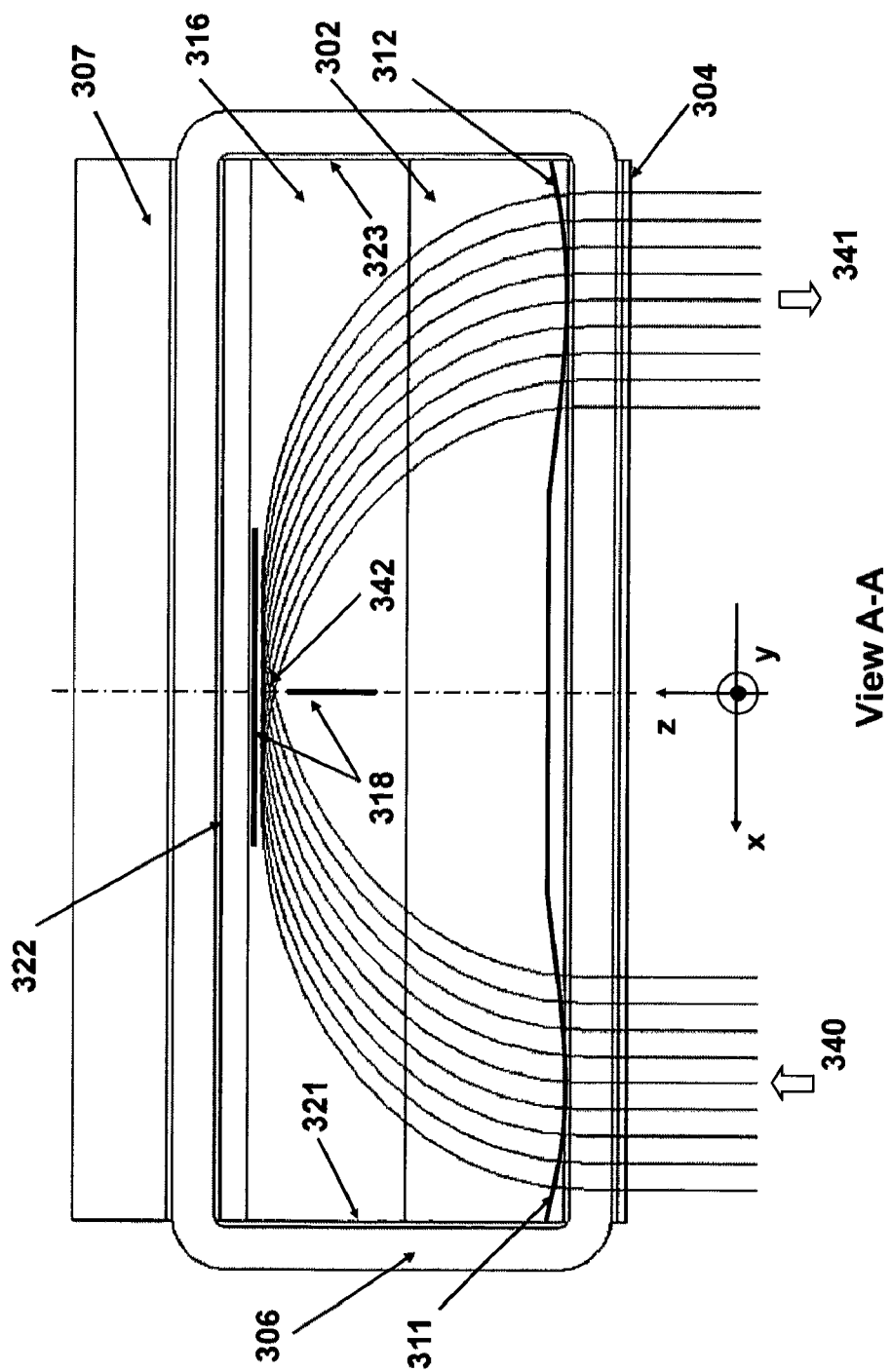
FIG. 17 illustrates a preferred embodiment of the present invented mass analyzer magnet in cross section view. The magnet pole has a rectangular shape.
Figure 18:
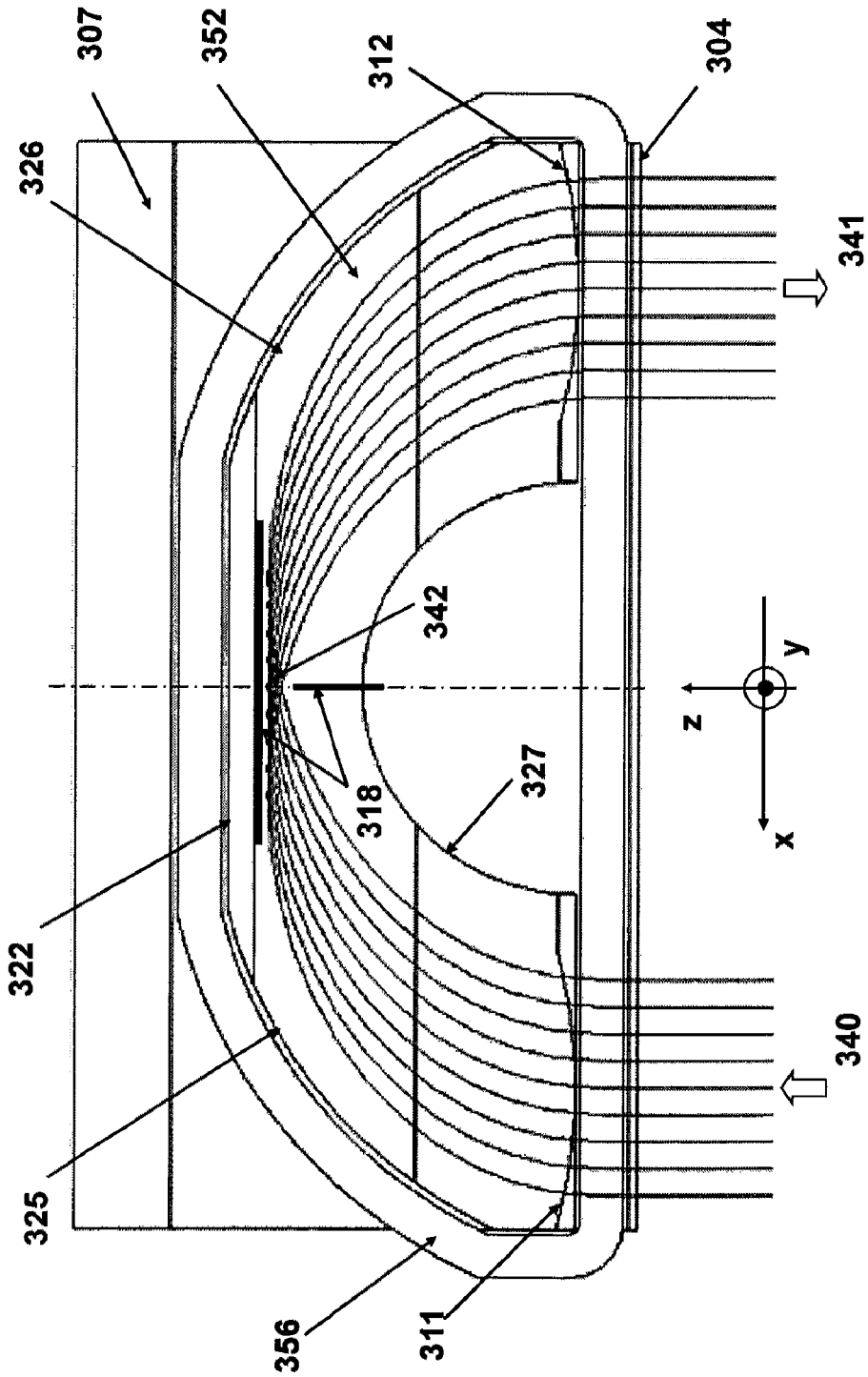
FIG. 18 illustrates another preferred embodiment of the present invented mass analyzer magnet in cross section view, the magnet pole has the shape trimmed according to the beam envelop inside the magnet
Figure 21:
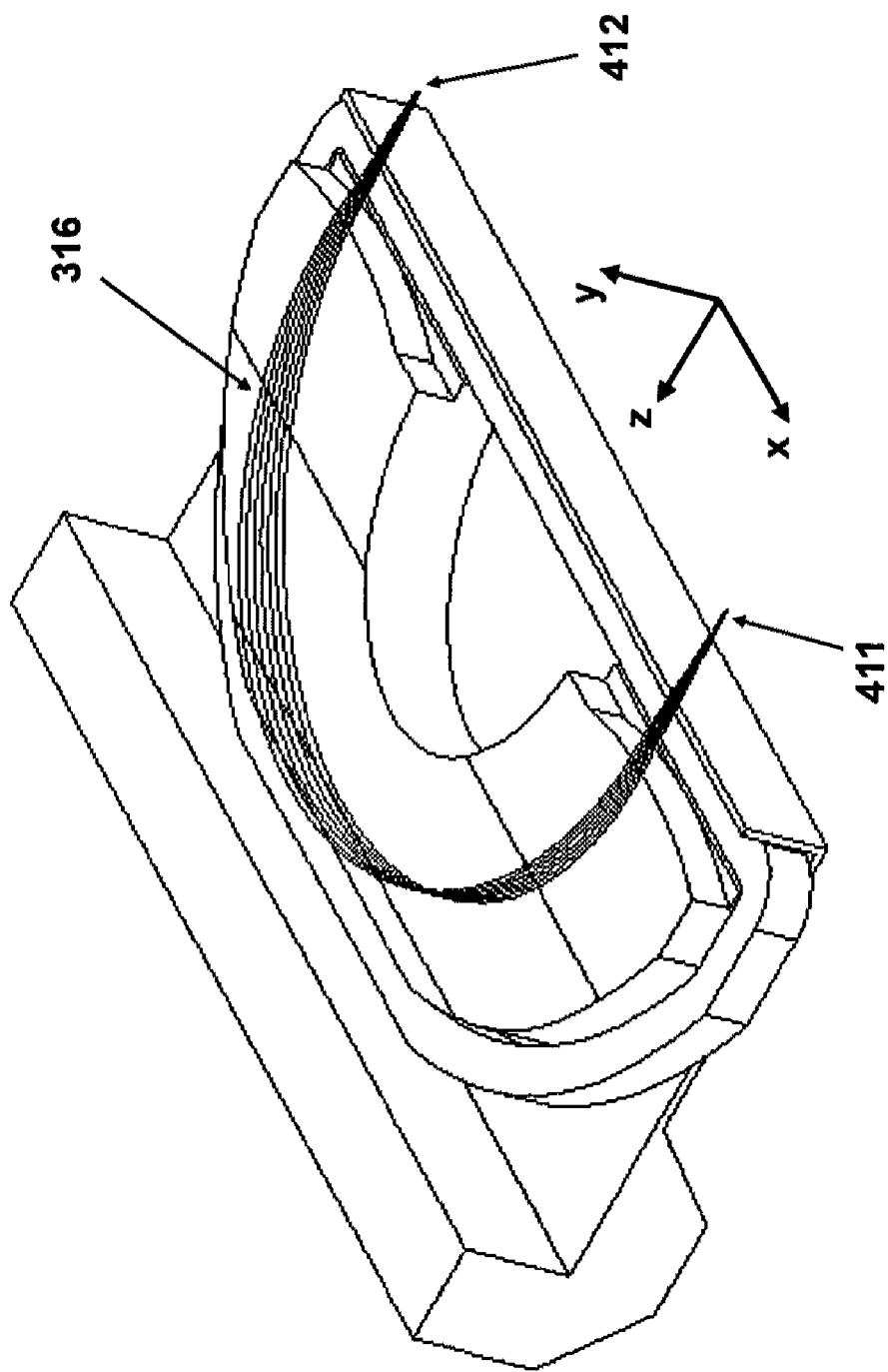
FIG. 21 shows ion orbits of a beamlet inside the magnet of FIG. 20 in perspective view.

The preferred embodiments of the present invented mass analyzer magnet are shown in side view of FIG. 15, in cross section views in FIG. 17 and FIG. 18, and in perspective views in FIG. 19a, FIG. 19b and FIG. 21. The preferred embodiments have the features that have been described in the last section of "The Technical Underpinnings of the Present Invention". With those features, the preferred embodiments can do the mass analysis for ribbon beams.

The coordinate system used in FIG. 15, FIG. 16, FIG. 17 and FIG. 18 is standard right hand Cartesian coordinate system. The three coordinates x, y and z are depicted in those figures.

The FIG. 15 illustrates the side view of the magnet. In general, the magnet is in mirror symmetry to the mid-plane 310. The upper and the lower halves of the magnet are in general identical. The magnet comprises the magnet yoke 320 and an upper coil 305 and a lower coil 306. The magnet yoke 320 is made of ferromagnetic material, for example, 1010 steel, and comprises the upper magnet pole 301 and lower magnet pole 302, the magnet return yoke. 307, and the upper magnet field clamp 303 and lower magnet field clamp 304. The gap 330 between the magnet poles 301 and 302 is for the passage of ion beams. The ion beam 340 goes into the magnet gap 330 from the opening between the magnet field clamp 303 and 304. The magnetic field required to bend the ion beam is generated by electrical current passing through the coils. The direction of the magnetic field is generally the vertical direction, and the magnetic field lines terminate on the top and bottom portion of the magnet poles normal to the inside surfaces thereof. As will be appreciated by those skilled in the art, the gap 330 is housed in a vacuum enclosure (not shown).

The upper coil 303 comprises windings of conductive wire which is wound to fill an envelope of rectangular cross section which follows a path around the magnet pole 301. The rectangular envelope along the path so described is filled by winding a predetermined number of turns of conductor along it. The coil so formed may optionally be impregnated with resin to form a rigid body. The lower coil 304 is formed in a similar way to the upper coil. Both coils may be connected in series to a source of current, or two sources of current, one for each coil, may be used. The effect of passing electrical current through the coil is to generate vertically oriented magnetic field within the enclosed volume 330 bounded the upper and the lower pole.

The field clamp 303 and 304 are the plates partially surrounding the coils. The clamps are connected to the magnet poles in this preferred embodiment and are made of ferromagnetic material. The clamps could be detached from the magnet poles in other embodiments. The field clamps are adopted here to reduce the extension of the fringe field which caused by the coil's electrical current. As a result, the magnetic field falls rapidly to a near zero value within the distance from the front pole edge of the magnetic pole of 311 and 312 to the field clamp in the direction of z coordinate.

Figure 16:
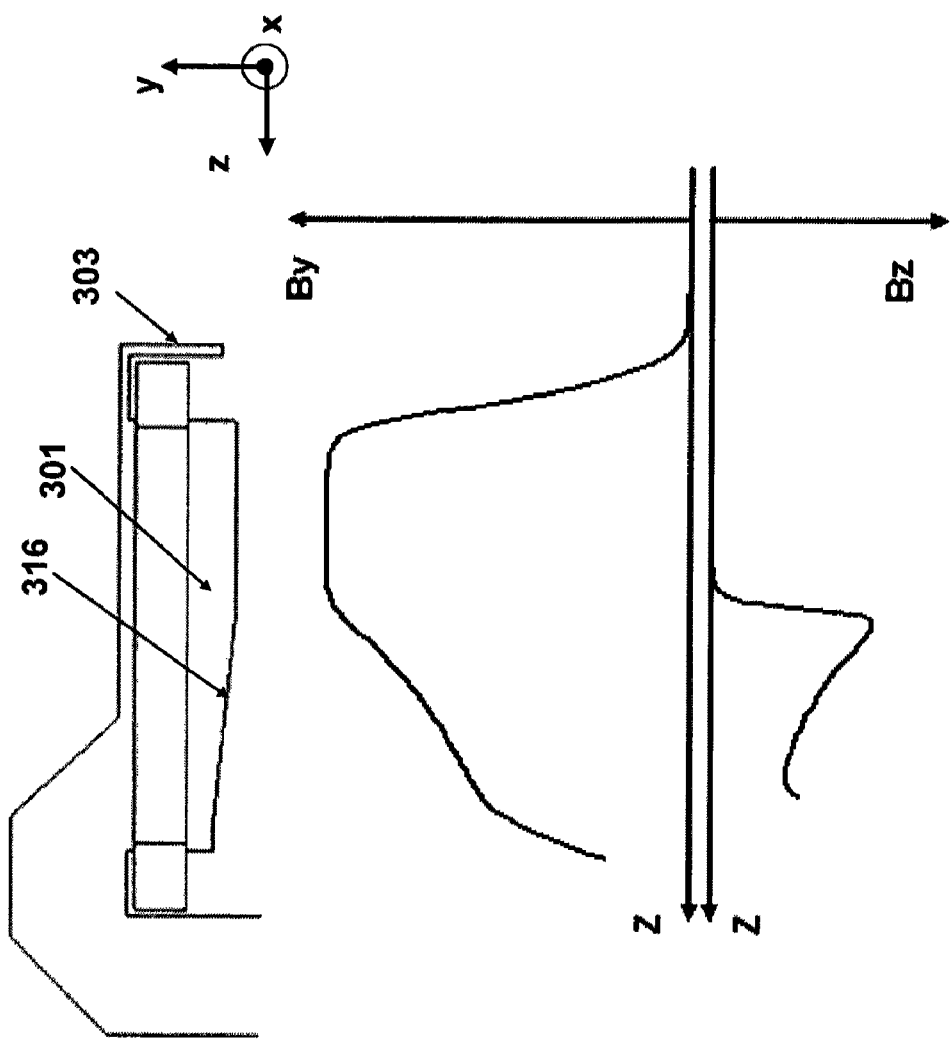
FIG. 16 shows the distribution of the magnetic field component By on the mid-plane and the distribution of the magnetic field component Bz off the mid-plane, together with the sketch of the magnet.

FIG. 16 shows the distribution of the magnetic field component By on the mid-plane of 310 together with the sketch of the magnet. It is clear that the magnetic field drops rapidly to near zero because of the existence of the field clamp 303.

The magnetic field distribution is primarily determined by the magnet pole 301 and 302. The two poles 301 and 302 are, in a general mirror symmetric to the mid-plane 310. The steel pole 301 and 302 provide a convenient and effective means of shaping the magnetic field generated by the magnet. The pole surfaces 316 are frequently non-planar in order to shape the magnetic field for the purpose of beam orbit control. In general as shown in FIG. 16, the pole surface 316 is made by sweeping the curve in y-z plane along x direction. This curve can be adjusted to any shape to give a specific field distribution along the z direction to meet the beam orbit control requirement. In this preferred embodiment, the pole surface is tapered up to make the magnetic field drops with z as shown in the FIG. 16. Such a field distribution will make the ions go through elliptical orbits.

FIG. 16 also shows the distribution of the magnetic field component Bz off the mid-plane 310 together with the sketch of the magnet. The Bz and By are not on the same scale in the FIG. 16. The component Bz is the result of surface shaping of the magnet pole surface 316. It is critical in providing focusing force to the ion beam in the vertical direction y. This focusing force will reduce the transportation loss of the ion beam inside the magnet when ion beam has divergence in the vertical direction y. This effect of the vertical focusing force will be further explained by the FIG. 22.

FIG. 17 illustrates a preferred embodiment of the present invented mass analyzer magnet in cross section view. The magnet pole has a rectangular shape The boundary of the pole 302 comprises the front pole edge 311 and 312, the side pole edges of 321 and 323, and the rear pole edge of 322. The coil 306 follows a path around the magnet pole 302.

The input ribbon beam 340 goes into the magnet and come out as the output ribbon beam 341. In this preferred embodiment, the input ribbon beam 340 goes into the magnet with an angle perpendicular to the field clamp 304, and the ribbon beam 340 is bent by 180 degrees to form the output ribbon beam 341. In FIG. 17, the trajectories of nine ions at different positions of the ribbon beam have been displayed. In the middle of the magnet, the ribbon beam is focused into a tight focal point 342 where a mass resolving aperture 318 can be setup to mass analyzing the ribbon beam.

The pole surface 316 of the pole 302 has been shaped to give specific field distribution along the z direction. The front pole edges of 311 and 312 have be shaped to further reduce the focal point size 342. The shape of 311 and 312 can be carefully designed to give tight focal point size and to limit the growth of the system aberration. In the preferred embodiment of FIG. 18, the edge of 311 and 312 are of the shape of convex.

FIG. 18 illustrates another preferred embodiment of the present invented mass analyzer magnet in cross section view. The magnet pole 302 in the FIG. 17 has been trimmed into the magnet pole 352 in FIG. 18 according to the envelope of the ribbon beam inside the magnet. The boundary of the magnet pole 352 comprises the front pole edge 311 and 312, the inner pole edge 327, the side pole edges of 325 and 326, and the rear edge of 322. The pole 352 is more efficient than the pole 302. The total magnetic field region of the pole 352 is about 25% less than that of the pole 302. Therefore, the pole 352 largely reduces the overall weight and the power consumption of the magnet. Coil 356 follows a path around the magnet pole 352. The overall size of the coil 352 is smaller than that of the coil 302, which will reduce the Ohm loss of the coil.

Figure 19:
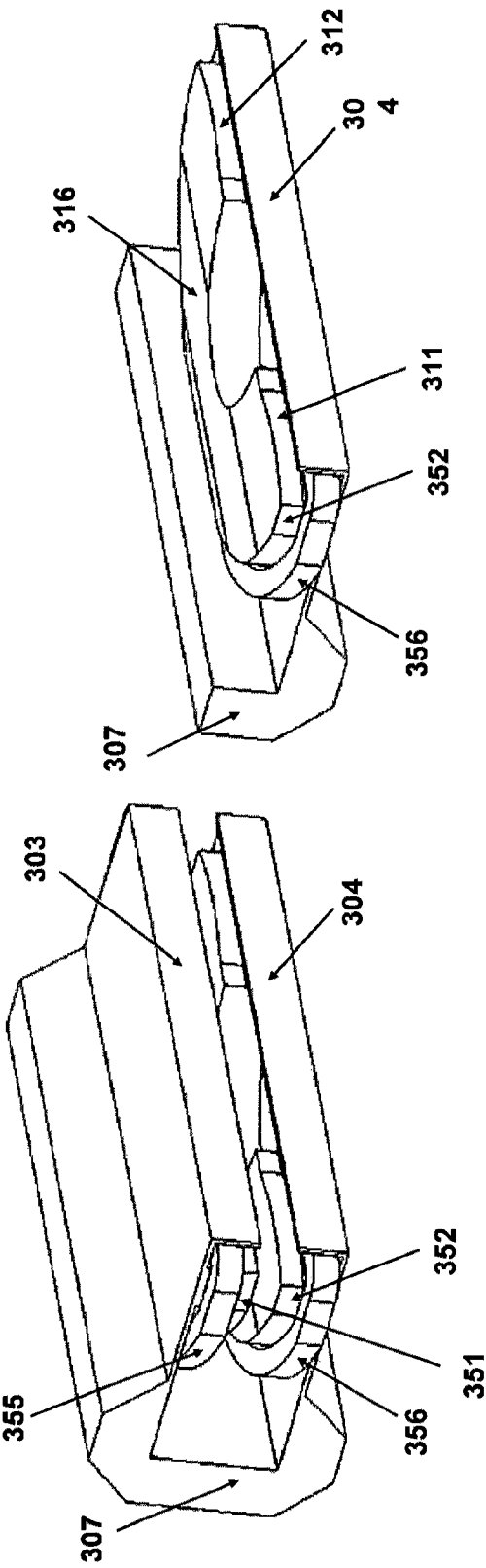
FIG. 19a and FIG. 19b are perspective views of a preferred embodiment as showed in FIG. 18.

FIG. 19a and FIG. 19b are perspective views of a preferred embodiment as showed in FIG. 19. FIG. 19a shows the full magnet, and FIG. 19b shows the lower half of the magnet. In general, the upper and the lower halves of the magnet are in mirror symmetry. The magnet is comprised of an upper coil 355 and a lower coil 356, an upper magnet pole 351 and lower magnet pole 352, the magnet return yoke 307, and the upper magnet field clamp 303 and lower magnet field clamp 304. The magnet pole 351 and 352, the magnet return yoke 307, and the filed clamp 303 and 304 are made of ferromagnetic material, for example, 1010 steel. The spacing between the upper and lower poles is for the passage of ion beams. This spacing is housed in a vacuum enclosure (not shown). For this preferred embodiment, the input ion beam will be bent by 180 degrees. Therefore, the left and the right halves of the magnet are in general in mirror symmetry.

The magnet pole surface 316 has been carefully shaped in the design to guide the ions through elliptical orbits and to give vertical focusing to the ion beams. The magnet pole 355 and 356 have been trimmed to the shape to fit the envelope of the ribbon beam in order to reduce the overall magnet weight and power consumption. The pole front edges of 311 and 312 have been curved to further reduce the focal point size.

Figure 20:
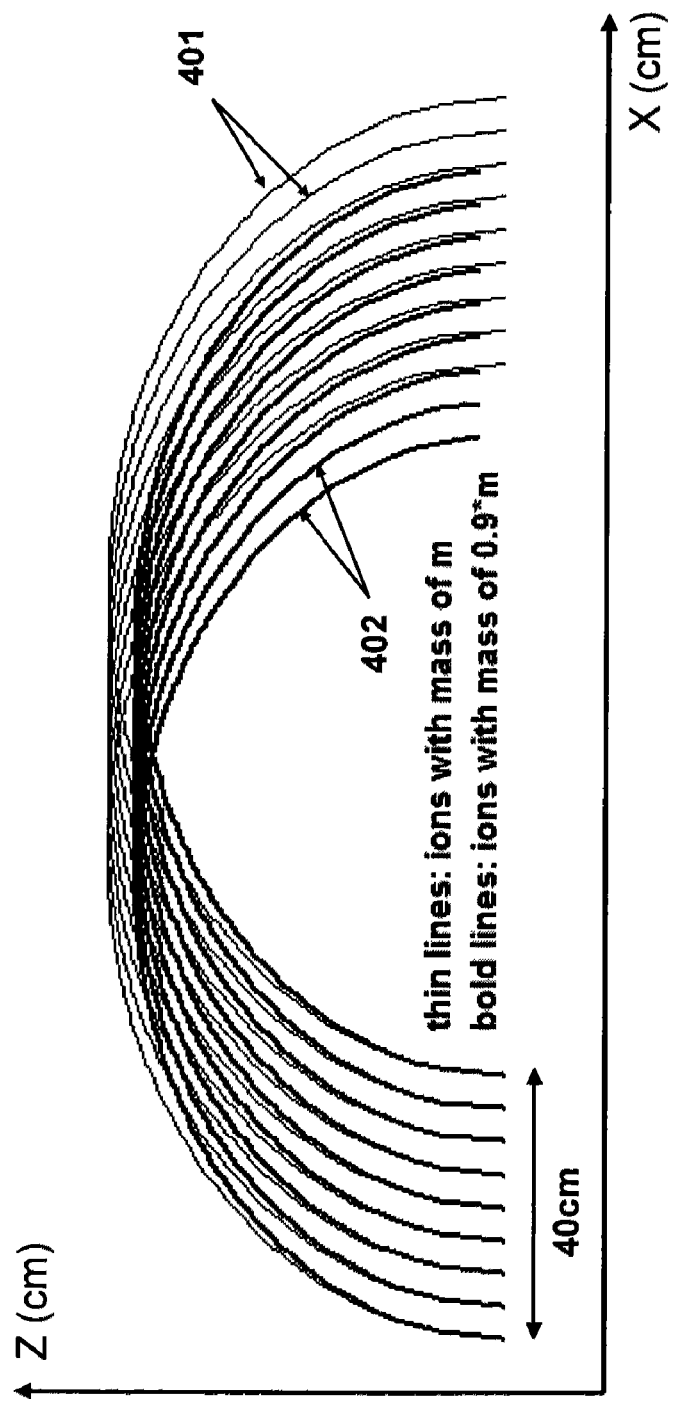
FIG. 20 shows ion orbits of a ribbon ion beam inside the magnet of FIG. 20 in the plane where the long axis of the ribbon beam lies.

FIG. 20 shows the orbits of the ribbon ion beam inside the magnet of FIG. 19 in the plane where the longer dimension of the ribbon beam lies. The trajectories of nine ions at different positions of a 400 mm wide ribbon beam have been displayed. The orbits of the ions with a mass of m have been grouped into thin lines of 401. The orbits of the ions with a mass of 0.9*m have been grouped into bold lines of 402. In the middle of the magnet, the ions with different masses form their own focal points and are clearly separated. A mass resolving aperture can then select the ions with wanted masses.

FIG. 21 shows the orbits of divergent ion beam inside the magnet of FIG. 19 in perspective view. The ion beam coming out of the ion source usually has divergence in the shorter dimension of the ribbon beam. The input beam 411 represents a beamlet in the ribbon beam. The input beamlet 411 is in the center of the ribbon beam, and it has a divergent angle distribution over the vertical direction of y. The trajectories of seven ions with different divergent angle of y' have been displayed in the FIG. 21. The divergent beamlet 411 expands in the y direction because of the beam divergence in the first half of the magnet. In the same time, it also receives focusing force from the magnetic field component Bz along the path. In the second half of the magnet, the accumulated focusing force overcomes the beam divergence and the beamlet contracts in the y direction. As a result, the output beamlet 412 is a focused beamlet in y direction.

The vertical focusing property of the magnet can be adjusted in the design stage by shaping the magnet pole surface 316. It is worth to point out that for both the focusing and the elliptical orbit requirements, they both require the pole surface to be shaped in the same way. The pole needs to be opened out as FIG. 16 indicated.

Figure 22:
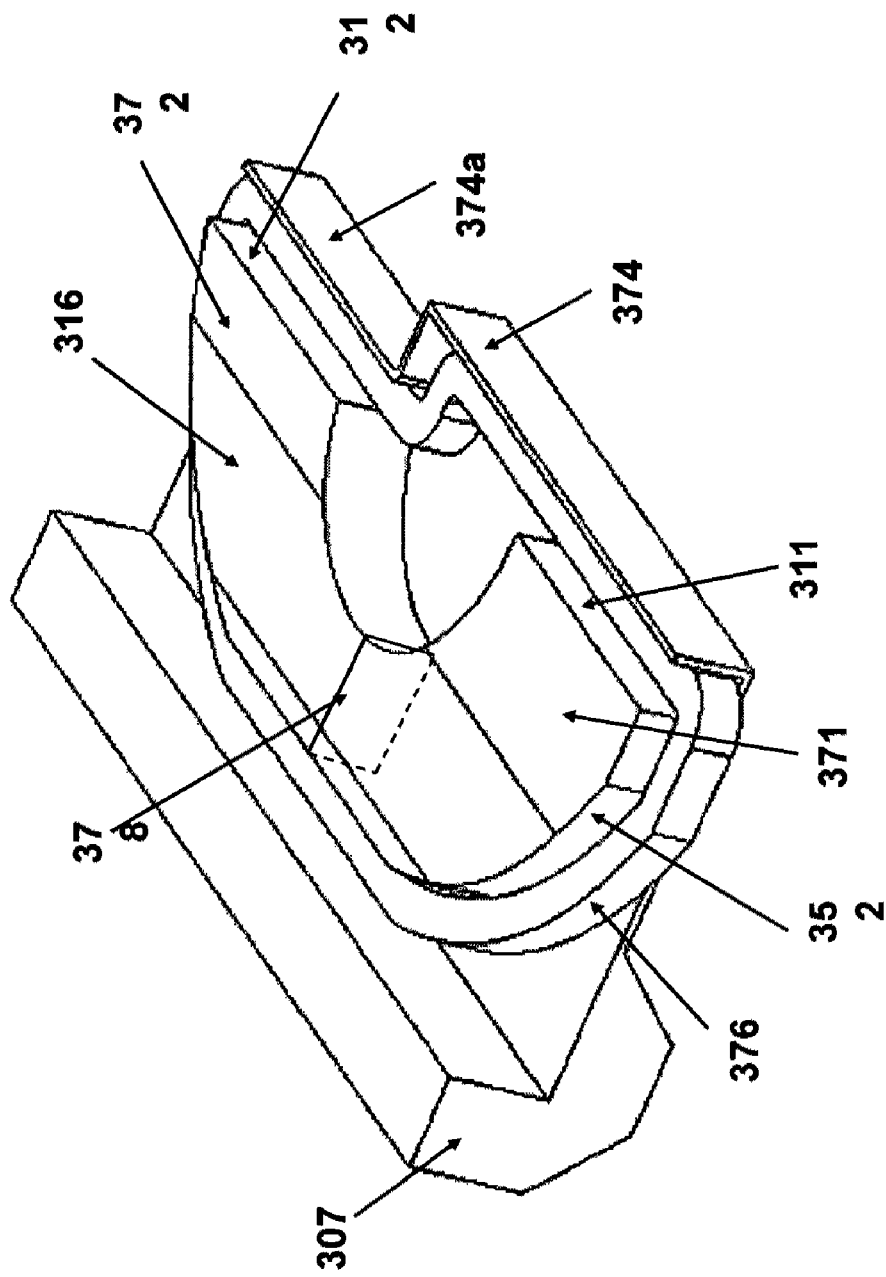
FIG. 22 is a perspective view of another preferred embodiment with general bending angles of 90 to 180 degrees to realize the concept in FIG. 14.

FIG. 22 is a perspective view of another preferred embodiment with general bending angles of 90 to 200 degrees to realize the concept in FIG. 14. In FIGS. 19 and 19a, the magnet is designed with bending angle of 180 degrees. The left and the right halves of the magnet pole in FIG. 19 are in general the same size and in mirror symmetry. However, depends on the system design specifications and system package requirement, the required bending angle of the magnet may be in the range of 90 to 200 degrees. Such a general bending angle requirement can be realized by removing the left-right mirror symmetry of the magnet. FIG. 22 only shows low half of the magnet because of the symmetry of the magnet. The pole 352 comprises a left pole 371 and a right pole 372. The left pole 371 and the right pole 372 are connected at the connection surface 378. The left pole and the right pole are in general different in size and are not symmetric to their connection surface 378. The special case would be that the left pole and the right pole are same in size and are symmetric to their connection surface 378. The coil 376 follows a path around the left pole 371 and the right pole 372. The field clamp will 304 and 304a will be repositioned to partially surround the coil 376 to reduce the fringe field. For the magnet of non-180 degree bending angles, the input ribbon beam will have an angle to the magnet when it goes into the magnet, and the output ribbon beam comes out of the magnet will have another angle to the magnet.

III. Preferred Systems Comprising the Present Invention of Magnet

Figures 23, 23A:
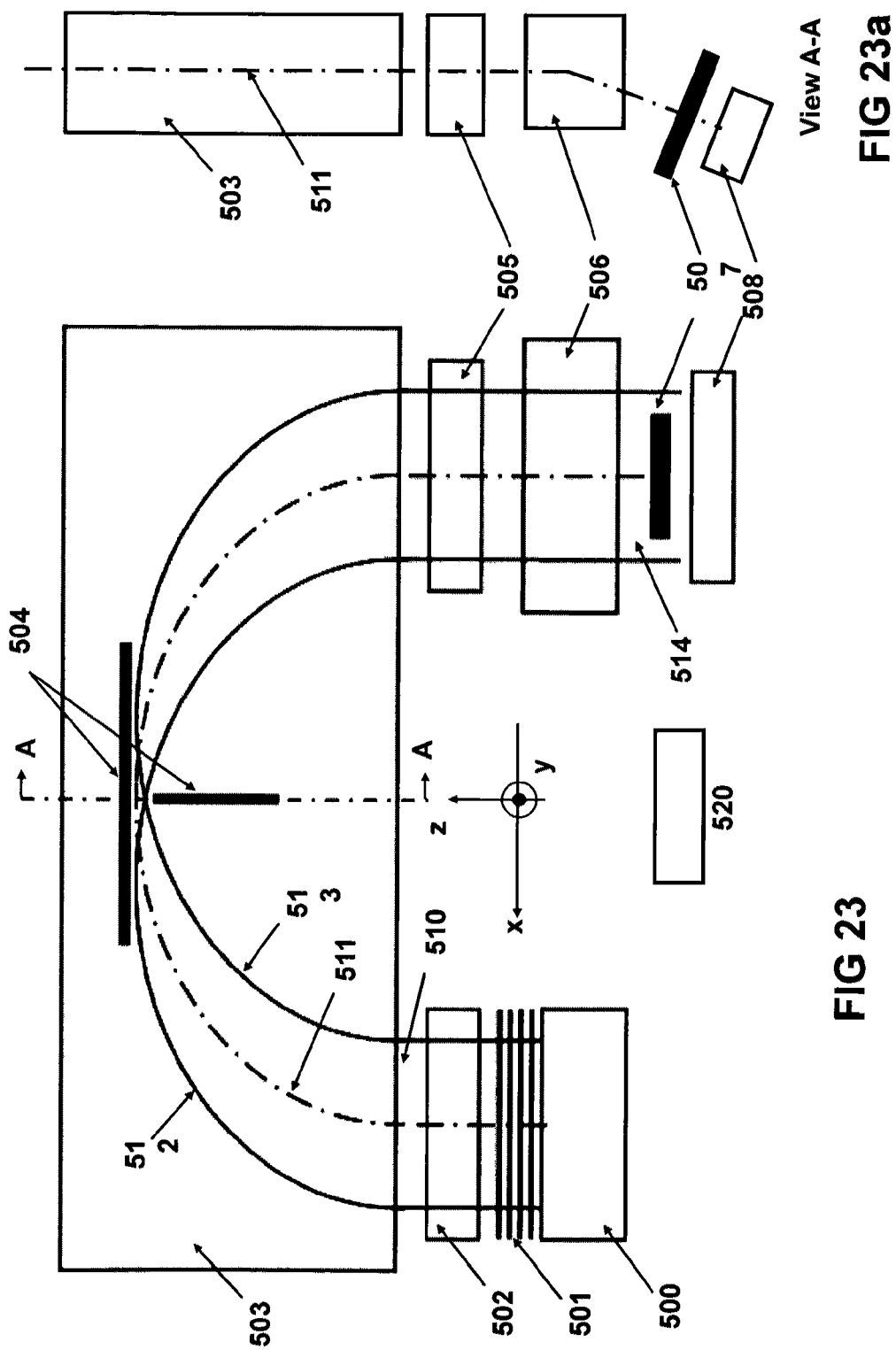
FIG. 23 is a sketch of a ribbon-beam ion implantation system according to the present invention in which a 180 degrees magnet is integrated.
FIG. 23a is the side view of FIG. 23, and shows that the deflecting decel bends the beamline.

FIG. 23 is a sketch of a ribbon-beam ion implantation system according to the present invention in which a 180 degrees magnet is integrated. The ion implantation system comprises an ion source unit 500, the extraction unit 501, the first uniformity and angle correction unit 502, a mass analyzer magnet unit 512, the resolving aperture unit 504, the second uniformity and angle correction unit 505, an optional decel unit 506, the target and target transport unit 507, the beam dump and diagnostics unit 508, These units are housed in a vacuum enclosure (not shown). The ion implanter system also comprises a controller unit 520.

The ion source 500 can be either a Bernas-type ion source or a RF-type ion source, thought a RF-type ion source is preferred in making large volume plasma for extraction. The rf-type ion source comprises an elongated plasma chamber in which plasma is generated by RF excitation of a source gas using an antenna and an RF plasma oscillator. The details of the ion source are not shown here, but the U.S. Pat. No. 6,664,548 can serve as an example design of such type of ion source.

The source chamber of the ion source 500 has an elongated opening which is much wider in the x direction than its height in the y direction. A set of extraction apparatus 501 is used to extract the ion beam from the ion source chamber by applying a relative negative potential on the first electrode. The extraction apparatus provides electric fields via a plurality of extraction electrodes having elongated extraction slits or apertures similar to the elongated opening on the ion source chamber. The emergent beam is in general parallel to the normal direction of elongated extraction slits, which is the direction of z direction in the FIG. 23. As a result, a ribbon-shaped beam 510 is produced, having a rectangular cross-section with a longer dimension that lies in the x-z plane, which is the bending plane of the magnet 503. The extracted ribbon beam is wider than the diameter of the target.

Before entering the mass analyzer magnet 503, the ribbon beam will go through the first angle and uniformity correction unit 502. This unit can adjust the beamlet's position and angle via local electrical or magnetic field. The local electric or magnetic field can be controlled responsively to the measurements by the beam diagnostic unit 508 to control the current density and the angle in the measurements. As a result, the uniformity of current density and the local angle variation of the ribbon beam at the target 507 can be corrected to satisfied small level. The U.S. Pat. No. 7,078,713 gives description of several example designs of correction unit for the same purpose.

The ribbon beam will continue go into the mass analyzing magnet 503. The magnet is the invented magnet which has been described in detail in the section of "Preferred embodiments for the present invention of magnet", and the preferred bending angle is 180 degrees as shown in FIG. 19. The mass analyzer magnet receives the ribbon beam and focuses the beam into a narrow slit that corresponds to resolving aperture 504 inside the magnet. The resolving aperture includes a mechanical setup to adjust its opening. Ions having different masses are thus blocked by the aperture, thereby providing ions of only a desired mass. The desired ions come out of the resolving aperture, then expand to form a ribbon beam again and come out of the magnet. 511 indicates the center of the ribbon beam, 512 and 513 indicate the boundary of the beam inside the magnet.

After coming out of the mass analyzer magnet, the ribbon beam will go through the second angle and uniformity correction unit 505. This unit can adjust the beamlet's position and angle via local electrical or magnetic field. The local electric or magnetic field can be controlled responsively to the measurements by the beam diagnostic unit 508 to control the current density and the angle in the measurements. As a result, the uniformity of current density and the local angle variation of the ribbon beam at the target 507 can be corrected to satisfied small level. The U.S. Pat. No. 7,078,713 gives description of several example designs of correction unit for the same purpose.

As the beam continues to travel downstream, the beam continues to keep its ribbon shape such that when the ion beam 514 reaches the target 507, it has sufficient width to cover the entire lateral size of the target. The target is then translated through this ion beam along a single path, one or more times, to implant a desired uniform dose of ions into its surface.

The target (typically wafer) transport unit 507 (not shown) usually includes an electrostatic chuck and a translation stage for moving the mounting wafer in two directions. These directions typically are up and down relative to the mid-plane (i.e., in and out of the plane of paper). The wafer transport unit further comprises load locks and robot arms for moving a wafer from one load lock to the transport mechanism for ion implantation and for moving an implanted wafer from the transport mechanism to a load lock.

The beam diagnostics unit 508 comprises several devices. One device is a beam dump behind the target for absorbing unwanted ions; the other device is a Faraday beam profile measurement system located in close proximity to the target wafer for scanning across the longer transverse dimension of the ion beam to measure the ribbon beam uniformity and to provide the measurement data back to the beam density controller 520. Another device is a plurality of Faraday cups positioned proximity to the target wafer as to detect an actual density profile associated with the ribbon ion beam. Another device is to measure the beam angle variations across the ribbon ion beam. Yet another device to monitor the variation of the beam current during the implantation for the purpose of the implantation process control.

The controller unit 520 controls the operation of each unit of the system. It also tunes each unit based on the measurement result from the beam diagnostic unit 508.

The system can further include an optional decel unit 506 for producing low energy beams, for example, the Boron beam from 0.1 KeV to 5 KeV. The details of the decel unit is not shown here, but the U.S. Pat. No. 6,441,382 gives an example design of such type of deflecting decel. The so-called deflecting decel unit does two functions at the same time. It decelerates the ion beam from high energies (for example 5 to 20 KeV) to low energies (for example 0.1 to 5 keV). The advantage of doing deceleration is to obtain high beam current at low energies. However, the normal decel beam includes high energy neutrals. The deflecting decel also bends the ion beam once or twice to change the direction of the ion's orbit. In this way, the high energy neutrals can be filtered out from the charged ions. FIG. 23a illustrates the center beam orbit 511 has been bent by the decel unit 506 in the y direction as shown in the drawing. The target unit 507 and the beam diagnostic unit 508 have been re-positioned according to the bending angle of the deflecting decel.

The small aberration mass analyzing magnet is extremely valuable for the operation of the decel unit. The aberration that the magnet adds to the ion beam can be amplified by the energy deceleration of the ion beam in the decel system, which is one of the reasons that the present serial high current ion implanter has difficulties in producing productive low energy ribbon beams. The magnet of this invention gives almost zero aberration to the ion beam, thus, the decel unit will produce high quality low energy ion beams.

Figure 24:
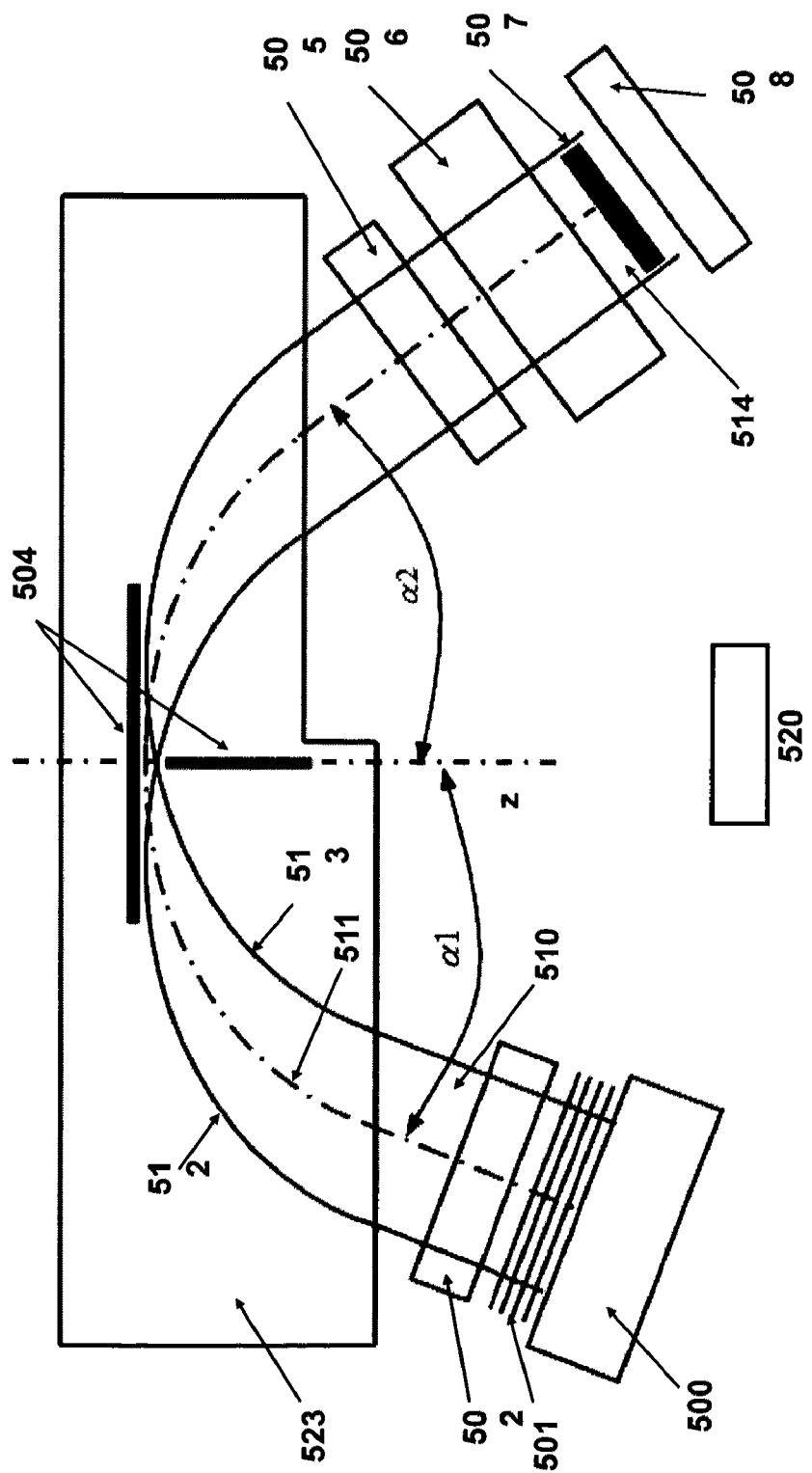
FIG. 24 is a sketch of another ribbon-beam system according to the present invention in which a non-180 degree magnet is integrated.

FIG. 24 is a sketch of another ribbon-beam system according to the present invention in which a magnet with more general bending angles is integrated. The mass analyzer magnet can have the bending angle of either the preferred 180 degree or the non-180 degree. For the case of 180 degree bending angle, the ion source and the target chamber are set up parallel to the magnet. The ribbon beam comes out of the ion source goes normally into the magnet, and the output ribbon beam comes normally out of the magnet. For the case of non-180 degree bending angle, the magnet is shown in FIG. 22. The ion source and the target chamber are set up with angles to the magnet. The ribbon beam comes out of the ion source, goes into the magnet at an angle of $\alpha 1$, and the output ribbon beam comes out of the magnet with another angle $\alpha 2$ to the magnet. The angle of $\alpha 1$ and $\alpha 2$ are defined as the beam incident angle and exit angle, respectively. The input ribbon beam 510 from the ion source has been bent by $(180-\alpha 1-\alpha 2)$ degrees to form the output ribbon beam 514.

In some applications, ion implantation equipment is expected not only to provide wide ribbon beams, but also able to provide narrow beams (or spot beam as often mentioned). Also, the implanter system is expected to be able to make switches between ribbon beam and spot beam. Here, ribbon beam is defined as wider than the feature size (diameter or width) of the workpiece; the narrow beam is defined as narrower than the feature size (diameter or width) of the workpiece.

Figure 25:
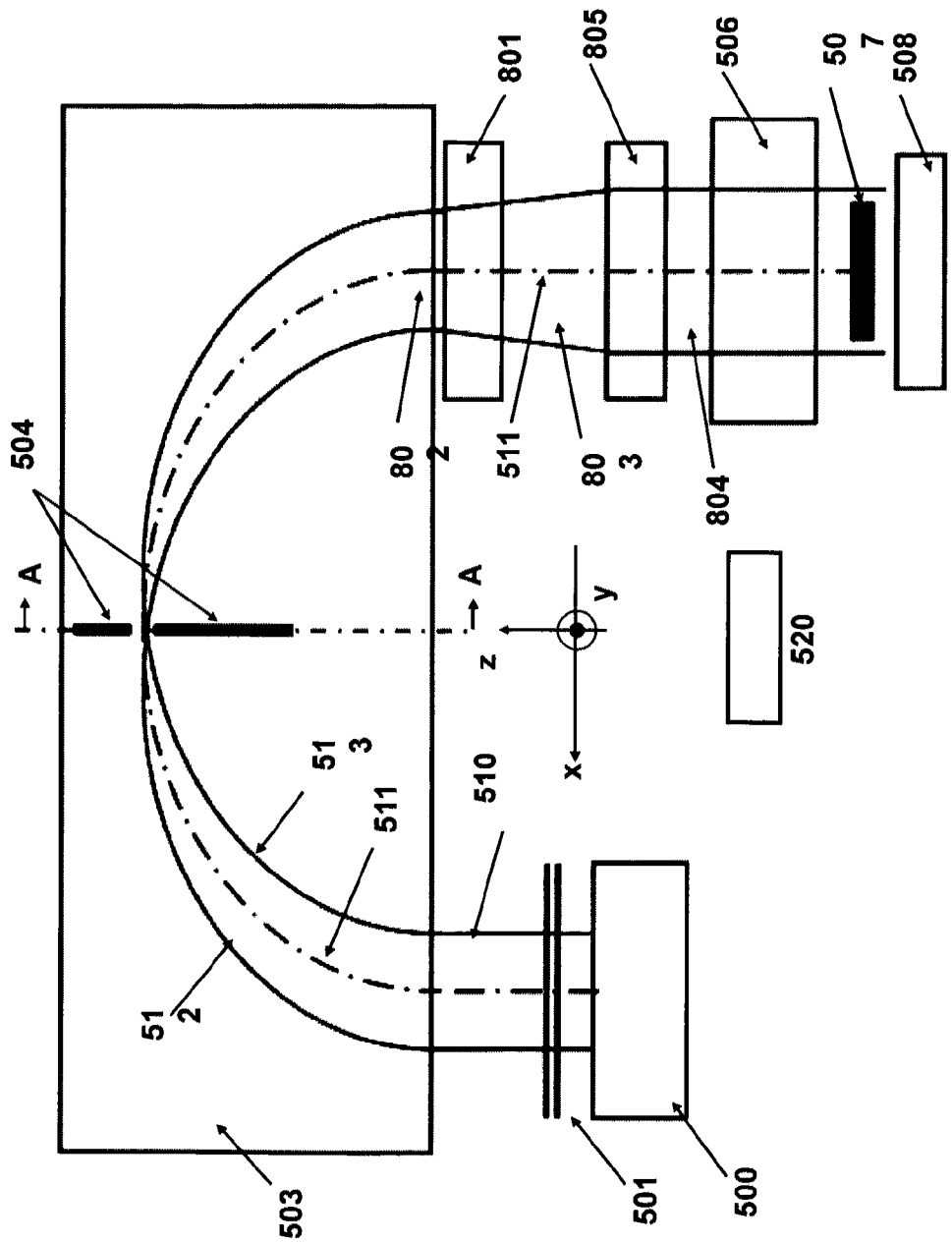
FIG. 25 illustrates a sketch of an ion implantation system according to the present invention in which a 180 degrees magnet is integrated. The Panofsky quadrupole is used to expand the beam to form a wide ribbon beam.
Figure 26:
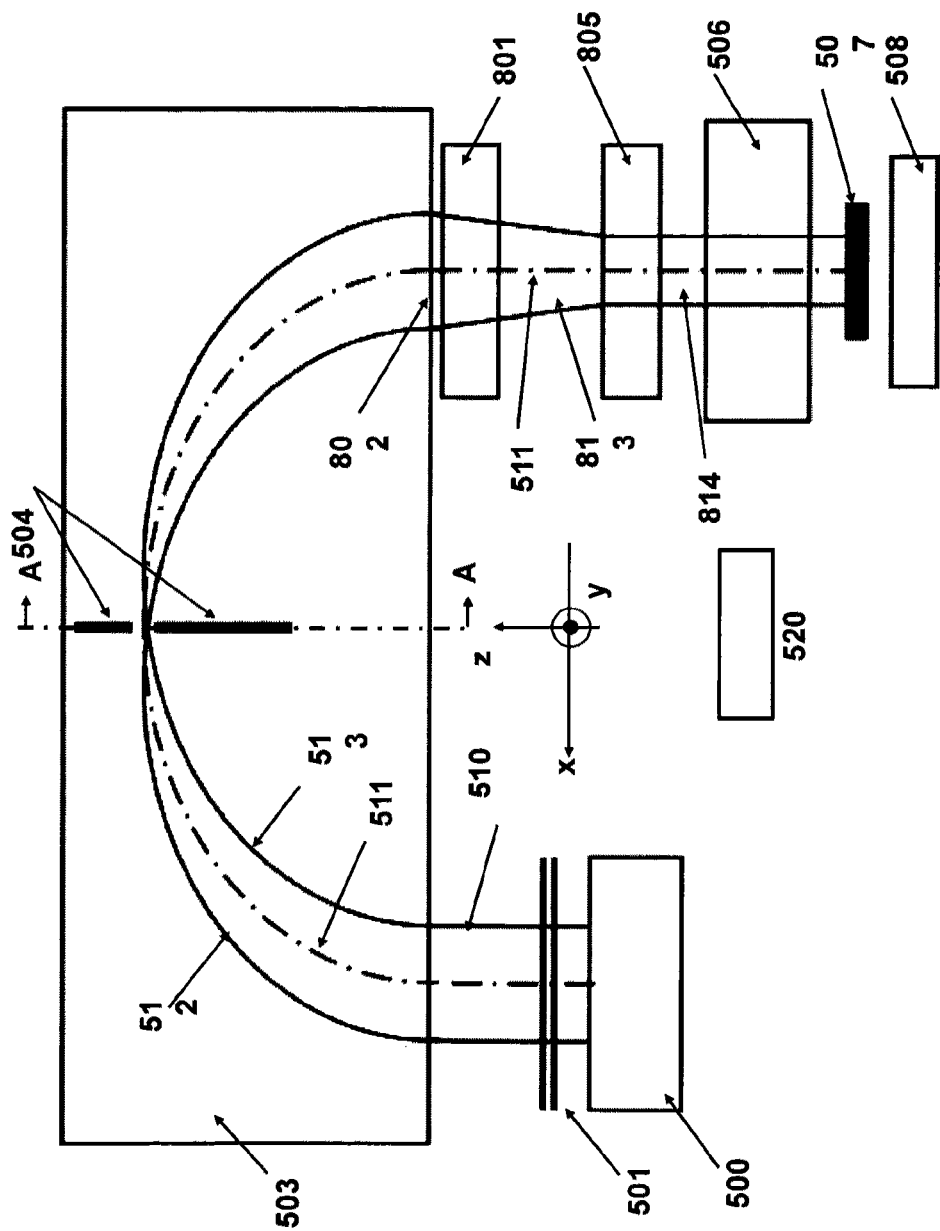
FIG. 26 illustrates a sketch of an ion implantation system according to the present invention in which a 180 degrees magnet is integrated. The Panofsky quadrupole is used to compress the beam to form a narrow beam.

FIG. 25 illustrates a sketch of another ion implantation system according to the present invention in which a 180 degrees magnet is integrated. A pair of Panofsky quadrupoles are used to expand the beam to form a wide ribbon beam. FIG. 26 illustrates how the pair of Panofsky quadrupoles is used to compress the beam to form a narrow beam.

In FIG. 25, the width of the ion source 500 is narrower than the feature size of the working piece. The ion source could be RF ion source or indirectly heated Bernas source. The extracted ion beam is the parallel beam 510. The parallel beam 510 goes into the mass analyzing magnet 503, and is then mass analyzed by the resolving aperture 504 inside the magnet 503. At the exit of the magnet 503, the beam is formed to another parallel beam 802. Two sets of angle device 801 and 805 are setup in the downstream of the magnet 503. The angle device could be, for example, the Panofsky quadrupole magnet. The first quadrupole magnet 801 can work in the defocusing mode, which can increase the divergent angle of ion beam 802. The divergent angle of a beamlet in beam 802 is directly proportional to its distance to the beam center 511. Therefore, parallel beam 802 becomes divergent beam 803. After a drift distance, the beam width increases to the desired width and arrives at the second quadrupole magnet 805. The second quadrupole magnet 805 works in the focusing mode, which corrects the divergent angle of the ion beam and forms a parallel ribbon beam 804. The width of the ribbon beam 804 is wider than the feature size (diameter or width) of the workpiece 507 (silicon wafer or glass plate). The ion implantation system may further include an optional deflecting decel unit 506 to produce low energy ion beam.

FIG. 26 illustrates how the pair of Panofsky quadrupoles is used to compress the beam to form a narrow beam in the implanter system of FIG. 25. The first quadrupole magnet 801 can work in the focusing mode, which can increase the convergent angle of ion beam 802. The convergent angle of a beamlet in beam 802 is directly proportional to its distance to the beam center 511. Therefore, parallel beam 802 becomes convergent beam 803. After a drift distance, the beam width decreases to the desired width and arrives at the second quadrupole magnet 805. The second quadrupole magnet 805 works in the defocusing mode, which corrects the convergent angle of the ion beam and forms a parallel narrow beam 804. The width of narrow beam 804 is narrower than the feature size (diameter or width) of the workpiece 507 (silicon wafer or glass plate).

Figure 27:
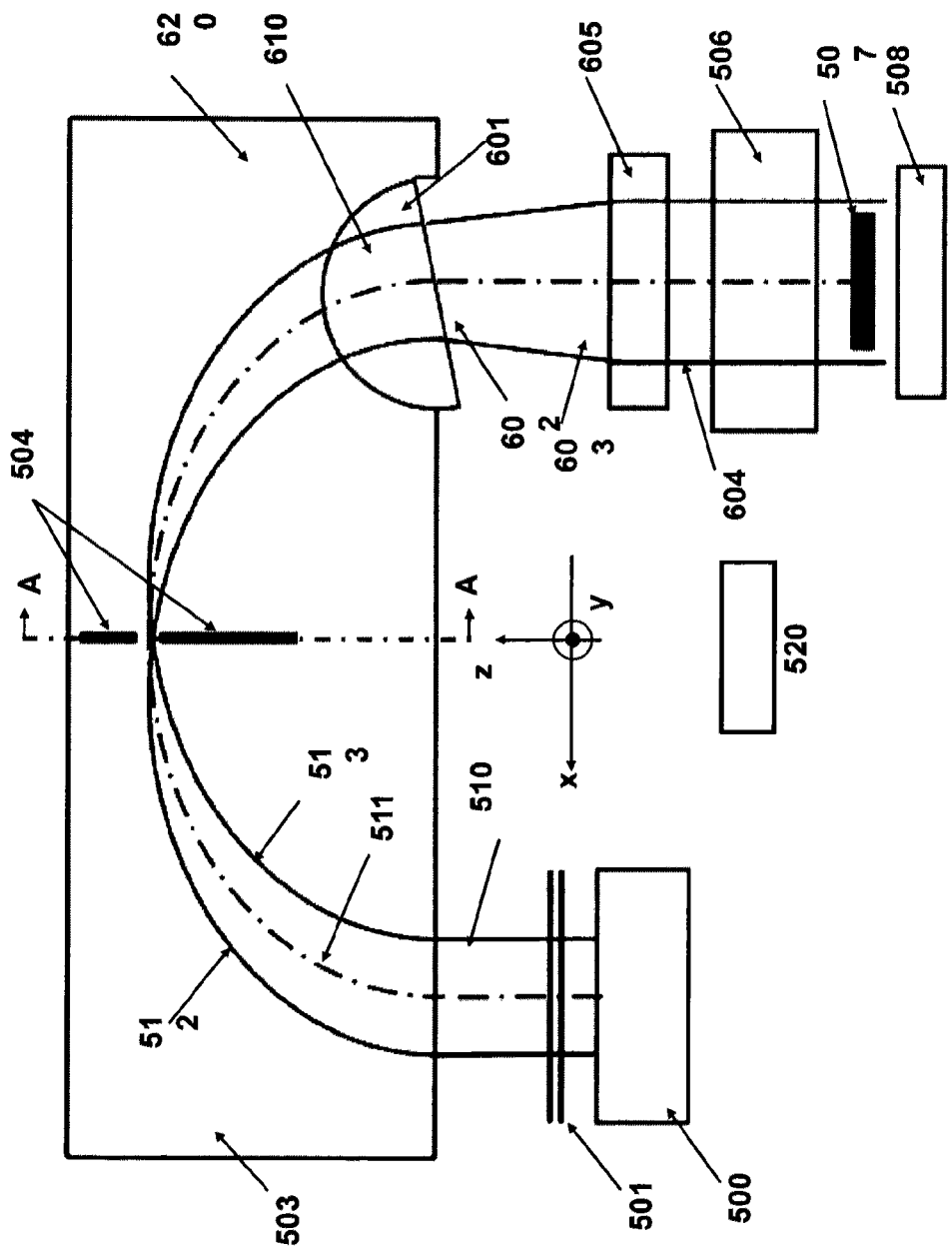
FIG. 27 illustrates a sketch of an ion implantation system according to the present invention in which a 180 degrees magnet is integrated. The exit rotation pole is used to expand the beam to form a wide ribbon beam.
Figure 28:
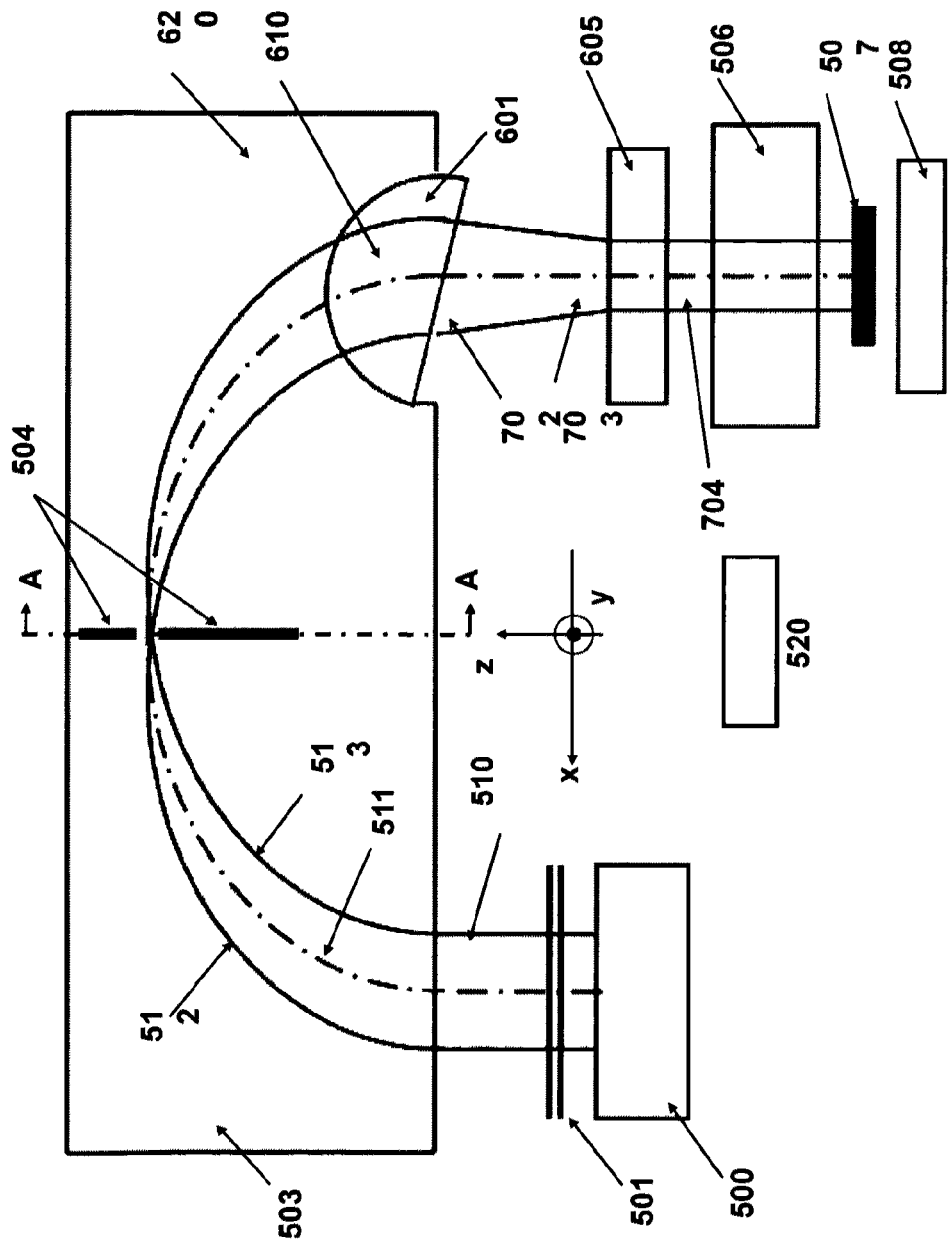
FIG. 28 illustrates a sketch of an ion implantation system according to the present invention in which a 180 degrees magnet is integrated. The exit rotation pole is used to compress the beam to form a narrow beam.

FIG. 27 illustrates a sketch of another ion implantation system according to the present invention in which a 180 degrees magnet is integrated. The exit rotation pole end is used to expand the beam to form a wide ribbon beam. FIG. 28 illustrates how the exit rotation pole end is used to compress the beam to form a narrow beam.

In FIG. 27, the width of the ion source 500 is narrower than the feature size of the working piece. The ion source could be rf ion source or indirectly heated Bernas source. The extracted ion beam is the parallel beam 510. The parallel beam 510 goes into the mass analyzing magnet 503, and is then mass analyzed by the resolving aperture 504 inside the magnet 503. At the exit of the magnet 503, the beam is formed to a parallel beam 610.

The present invention of the magnet 503 has another feature of exit pole rotation. Its second half of magnet pole 620 composites of a rotating magnet pole end 601. The rotating pole end can rotate relative to magnet pole 620 (rotating machinery structures not shown). When the angle between the rotating pole end 601 and the poles 620 is zero, the exit beam 610 will be a parallel beam. When the angle between the rotating pole end 601 and the poles 620 is non-zero, the exit beam 610 will be a non-parallel beam. The divergent or convergent angle of a beamlet in the beam 610 is proportional to the rotation angle of the rotating pole end and to its distance to the beam center 511.

In FIG. 27, the rotating pole end 601 is set to work in the defocusing mode, the exit beam 602 will be a divergent beam. The divergent angle of a beamlet in the beam 602 is proportional to the rotation angle of the rotating pole end and to its distance to the beam center 511. After a drift distance, the divergent beam 602 increases its width to 603 and arrives at the angle device 605. This angle device 605 can be, for example, a Panofsky quadrupole magnet. The quadrupole magnet 605 works in focusing mode which corrects the divergence angle of the ion beam and forms the ion beam into a parallel beam 604. The width of the parallel beam 604 is wider than the feature size (diameter or width) of the target workpiece 507 (silicon wafer or glass plate). The ion implantation system may further include an optional deflecting decel unit 506 to produce low energy ion beam.

FIG. 28 illustrates how the exit rotation pole end and an angle device are used to compress the beam to form a narrow beam in the implanter system described in FIG. 27. In FIG. 28, the rotating pole end 601 is set to work in the focusing mode, the exit beam 702 will be a convergent beam. The convergent angle of a beamlet in the beam 602 is proportional to the rotation angle of the rotating pole end 601 and to its distance to the beam center 511. After a drift distance, the divergent beam 702 increases its width to 703 and arrives at the angle device 605. This angle device 605 can be, for example, a Panofsky quadrupole magnet. The quadrupole magnet 605 works in defocusing mode which corrects the convergence angle of the ion beam and forms the ion beam into a narrow beam 704. The width of the narrow beam 704 is narrower than the feature size (diameter or width) of the target workpiece 507 (silicon wafer or glass plate). The ion implantation system may further include an optional deflecting decel unit 506 to produce low energy ion beam.

The ion implantation system of this invention has significant advantages over prior ion implantation systems. Serial-mode implantation is preferable to batch-mode because of throughput considerations and reduced risk in product loss in the event of machine failure. Serial ion implantation systems also have much simpler and less expensive wafer handling systems so that development, manufacturing, and operating costs are lower than batch-mode systems. By implementing the system design and configuration of this invention, equipment suppliers can meet the challenge of making a serial machine for implantation applications that is reliable and has competitive process control capability. Furthermore, the novel system configuration as now taught by this invention involves relatively few components and has fewer system aberrations compared to other serial high current methods. This invention provides a superior product to the semiconductor industry, especially for low energy, 300 mm applications and future 450 mm applications.

In addition to ion implantation, the process and apparatus of the present invention may also be used for film coating or carrying out other types of surface processing applications. As the beam is projected as a parallel beam with close to zero divergent angles, a highly uniform beam density is provided for implantation or depositing particles to achieve higher level of uniformity as the beam reaches the target surface. In addition, the ribbon beam can be 1000 mm wide or even wider. As a result, the invention finds application for deposition on a surface to form optical filter coatings or for different types of surface processing functions on glass, metals or a wide variety of materials.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A magnet system with high mass resolution and low aberration for mass analyzing the ribbon shaped ion beam comprising of:
    two planner magnet poles;
    two field clamps, connects to the magnet poles;
    two planner coils, each wound around a magnet pole, the path of the coil mainly follows the boundary of the magnet pole; the coil connects to the electrical power supply to produce the magnetic field in the spatial region between the two magnet poles;
    a return yoke connects the two planner magnet poles;
    a mass resolving aperture which is inside the spatial region between the two magnet poles to selectively pass only ions of the desired mass; and
    the said magnet is in substantial mirror symmetry to its mid-plane with one magnet pole, with one coil and one field clamp on each side; and
    the said spatial region between the two magnet poles serves as a spatial passageway for the traveling ion beam; and
    the said ribbon beam goes into the passageway of the magnet from the entrance end, the ribbon ion beam forms a focal spot in the middle of the passageway, the ribbon beam goes out of the passageway from the exit end.

2. The magnet system of claim 1, wherein the magnet system consisting the first half magnet and the second half magnet, the first half magnet and the second half magnet are connected together with a connection cross-section, the first half magnet and the second half magnet are either symmetric or asymmetric to the connection cross-section, the first half magnet has an entrance end, the second half magnet has an exit end, the ion beam goes into the said passageway from the entrance end and the ion beam goes out of the said passageway from the exit end.

3. The magnet system of claim 1, wherein the magnet system mass analyzes the ribbon shaped ion beam, the short axis of the ribbon beam is aligned to the magnetic field of the magnet and the long axis of the ribbon beam lies on the mid-plane of the magnet, the ribbon beam goes into the first half magnet from the entrance end, the first half magnet bends and focuses the input ribbon ion beam, the ribbon ion beam forms a focal spot at the connection cross-section of the first half magnet and the second half magnet, then the second half magnet bends and expands the focal spot into a ribbon beam at the exit end of the second half magnet, the output ribbon beam is in general the one-to-one image transformation of the input ribbon beam.

4. The magnet system of claim 1, wherein the mass resolving aperture is set at the focal point inside the magnet to selectively pass only ions of the desired mass to the second half magnet.

5. The magnet system of claim 1, wherein the surfaces of the magnet poles are carefully shaped, the magnet pole surfaces are shaped to provide either an uniform magnetic field or non-uniform magnetic field between the two magnet poles, the uniform magnet field will guide the ions go through curved orbits with constant radius in an uniform arc, whereas the non-uniform field will guide the ions go through curved orbits with varied radii, like part of an ellipse, and the non-uniform field distribution can change the focal spot size, the dispersion, and the mass resolving power, the magnet pole surface shaping also provides focusing force to the ion beam in the non-bending direction.

6. The method of claim 5, wherein the ion beam curved orbit can be ellipse-like, the long axis of the ellipse is b and the short axis of the ellipse is a, the ratio of b/a is in the range of 1 to 3, a is in the range of 200 mm to 2000 mm.

7. The magnet system of claim 1, wherein the magnet bends the ribbon beam through an angle between 90 degrees and 200 degrees, while the bending angle of 180 degrees is the preferred bending angle, for a bending angle of 180 degrees, the ribbon beam goes into and comes out of the magnet with normal angle to the magnet entrance end and normal angle to the magnet exit end, for non-180 bending angles of degrees, the ribbon beam goes into the magnet with an incident angle $\alpha 1$ and come out of the magnet with an exit angle $\alpha 2$.

8. The magnet system of claim 1, wherein the entrance end of the first half pole and the exit end of the second half pole can be further trimmed as straight end or curved end, the curved end can be either the concave shape or convex shape, this trim can further reduce the focal spot size, so as to minimize distortions and aberrations of the ion beam.

9. The magnet system of claim 1, wherein the shape of the magnet poles can be further trimmed according to the envelope of the ribbon beam orbits in order to reduce the weight of the magnet poles, and the coil can be wound around the shape of the further trimmed magnet pole.

10. The magnet system of claim 1, wherein the magnet pole can further include pole rotation end, the pole rotation end can be set at the pole entrance end, this entrance pole rotation end can rotate relative to the magnet pole entrance end, setting the rotation angle of the pole rotation end can adjust the beam density distribution or the angle distribution of the ribbon beam at the exit end of the magnet.

11. The magnet system of claim 1, wherein the magnet pole can further include pole rotation end, the pole rotation end can be set at the pole exit end, this exit pole rotation end can rotate relative to the magnet pole exit end, setting the rotation angle of the pole rotation end can adjust the exit ion beam to be either a parallel beam, a divergent beam, or a convergent beam at the exit end of the magnet.

12. An ion implanter system for implanting one or more work pieces with an ion beam, comprising:
   an ion source unit, comprising an elongated plasma chamber in which plasma is generated, the plasma chamber has an elongated opening to let the ions be extracted by the extraction unit, the width of the opening is generally wider than the width of the target, and the long direction of the opening is aligned on the bending plane of the magnet unit;
   an extraction unit, the extraction unit provides electric fields via a plurality of extraction electrodes with apertures similar to the elongated opening on the ion source chamber, those electrodes extract the ion beam from the ion source chamber, the ribbon-shaped beam is extracted as input beam for the downstream magnet unit, the extracted ribbon beam is generally wider than the width of the target, each individual ion beamlet of the ribbon beam is in general parallel to the normal direction of elongated extraction aperture;
   a first uniformity and angle correction unit;
   a magnet unit for mass analyzing the ribbon shaped ion beam, the magnet unit receives the ribbon beam from upstream units and focuses the beam into a narrow mass resolving aperture inside the magnet unit, the mass resolving aperture includes a mechanical setup to adjust its opening, ions with different masses are thus blocked by the aperture, thereby providing ions of only a desired mass, the desired ions come out of the resolving aperture, then expand to form a ribbon beam again as an output beam for downstream units, and the width of the ribbon beam is generally wider than the width of the target;
   a second uniformity and angle correction unit;
   an optional decel unit for producing low energy beams and removing the harmful energy contamination, the decel unit includes a plurality of electrodes, decreases the ion beam's energy, and bends the ion beam once or a number of times to change the direction of the ion's orbit, in this way, the high energy neutrals can be filtered out from the charged ions;
   a target and target transport unit, the target is translated through the ribbon ion beam along a single path, one or more times, to implant a desired uniform dose of ions into its surface;
   a beam diagnostics unit, which comprises several devices to measure ribbon beam uniformity and the beam angle variations across the ribbon ion beam, and to monitor the variation of the beam current during the implantation for the purpose of the implantation process control, and to dump the unused ion beam;
   a control unit, which controls the operation of the ion source unit, the extraction unit, the uniformity and angle correction unit, the magnet unit, the decel unit, the beam diagnostics unit, and the target and target transport unit, the control unit also tunes each unit based on the measurement result from the beam diagnostic; and
   the said ion source unit, extraction unit, and the uniformity and angle correction unit are on the entrance side of the said magnet unit; and
   the said second uniformity and angle correction unit, the said optional decel unit, the said target and target transport unit, and the said beam diagnostics unit are on the exit side the said magnet unit.

13. The ion implanter system of claim 12, wherein the uniformity and angle correction unit comprises a series of local electrodes or a series of local magnets, the local electric or magnetic field can be controlled by the series of electrodes or by the series of magnets, the local electrical or magnetic field can adjust the beamlet's position and angle, and, as a result, the uniformity of the ion current density and the local angle variation of the ribbon beam at the target can be corrected to a satisfied low level.

14. The ion implanter system of claim 12, wherein the magnet unit for mass analyzing the ribbon shaped ion beam, comprising of:
   two planner magnet poles;
   two field clamps, connects to the magnet poles;
   two planner coils, each wound around a magnet pole, the path of the coil mainly follows the boundary of the magnet pole; the coil connects to the electrical power supply to produce the magnetic field in the spatial region between the two magnet poles;
   a return yoke connects the two planner magnet poles;
   a mass resolving aperture which is inside the spatial region between the two magnet poles to selectively pass only ions of the desired mass; and
   the said magnet is in substantial mirror symmetry to its mid-plane with one magnet pole, with one coil and one field clamp on each side; and
   the said spatial region between the two magnet poles serves as a spatial passageway for the traveling ion beam; and
   the said ribbon beam goes into the passageway of the magnet from the entrance end, the ribbon ion beam forms a focal spot in the middle of the passageway, the ribbon beam goes out of the passageway from the exit end.

15. The magnet unit of claim 14, wherein the magnet comprising,
   the first half magnet and the second half magnet, the first half magnet and the second half magnet are connected together with a connection cross-section, the first half magnet has an entrance end, the second half magnet has an exit end;
   the said ion beam is the ribbon shaped ion beam, the short axis of the ribbon beam is aligned to the magnetic field of the magnet and the long axis of the ribbon beam lies on the mid-plane of the magnet, the ribbon beam goes into the first half magnet from the entrance end, the first half magnet bends and focuses the input ribbon ion beam, the ribbon ion beam forms a focal spot at the connection cross-section of the first half magnet and the second half magnet, then the second half magnet bends and expands the focal spot into a ribbon beam at the exit end of the second half magnet, the output ribbon beam is in general the one-to-one image transformation of the input ribbon beam;

the said surfaces of the magnet poles are carefully shaped, the magnet pole surfaces are shaped to provide either uniform magnetic field or non-uniform magnetic field between the two magnet poles;

the said ion beam curved orbit can be ellipse-like, the long axis of the ellipse is b and the short axis of the ellipse is a, the ratio of b/a is in the range of 1 to 3, a is in the range of 200 mm to 2000 mm;

the said magnet bends the ribbon beam through an angle between 90 degrees and 200 degrees, while the bending angle of 180 degrees is the preferred bending angle;

the said magnet pole can further include pole rotation end, the said pole rotation end can be set at the pole entrance end, the said pole rotation end can also be set at the pole exit end;

the entrance end of the first half pole and the exit end of the second half pole can be further trimmed as straight end or curved end;

the shape of the magnet poles can be further trimmed according to the envelope of the ribbon beam orbits in order to reduce the weight of the magnet poles, and the coil can be wound around the shape of the further trimmed magnet pole.

16. An ion implanter system for implanting one or more work pieces with an ion beam with different width, comprising:

an ion source unit, comprising an elongated plasma chamber in which plasma is generated, the plasma chamber has an elongated opening to let the ions be extracted by the extraction unit, the width of the opening is generally wider than the width of the target, and the long direction of the opening is aligned on the bending plane of the magnet unit;

an extraction unit, the extraction unit provides electric fields via a plurality of extraction electrodes with apertures similar to the elongated opening on the ion source chamber, those electrodes extract the ion beam from the ion source chamber, the ribbon-shaped beam is extracted as input beam for the downstream magnet unit, the extracted ribbon beam is generally wider than the width of the target, each individual ion beamlet of the ribbon beam is in general parallel to the normal direction of elongated extraction aperture;

a magnet unit for mass analyzing the ribbon shaped ion beam, the magnet unit receives the ribbon beam from upstream units and focuses the beam into a narrow mass resolving aperture inside the magnet unit, the mass resolving aperture includes a mechanical setup to adjust its opening, ions with different masses are thus blocked by the aperture, thereby providing ions of only a desired mass, the desired ions come out of the resolving aperture, then expand to form a ribbon beam again as an output beam for downstream units, and the width of the ribbon beam is generally wider than the width of the target;

a ribbon beam width adjustor unit to increase or decrease the width of the ribbon beam at the target;

an uniformity and angle correction unit;

an optional decel unit for producing low energy beams and removing the harmful energy contamination, the decel unit includes a plurality of electrodes, decreases the ion beam's energy, and bends the ion beam once or a number of times to change the direction of the ion's orbit, in this way, the high energy neutrals can be filtered out from the charged ions;

a target and target transport unit, the target is translated through the ribbon ion beam along a single path, one or more times, to implant a desired uniform dose of ions into its surface;

a beam diagnostics unit, which comprises several devices to measure ribbon beam uniformity and the beam angle variations across the ribbon ion beam, and to monitor the variation of the beam current during the implantation for the purpose of the implantation process control, and to dump the unused ion beam;

a control unit, the controller unit controls the operation of each unit of ion source unit, extraction unit, uniformity and angle correction unit, magnet unit, ribbon beam width adjustor unit, decel unit, beam diagnostics unit, and target and target transport unit, the control unit also tunes each unit based on the measurement result from the beam diagnostic; and the said ion source unit and the extraction unit, are on the entrance side of the said magnet unit; and the said ribbon beam width adjustor unit, the said uniformity and angle correction unit, the said optional decel unit, the said target and target transport unit, and the said beam diagnostics unit are on the exit side the said magnet unit.

17. The ion implanter system of claim 16, wherein the magnet unit for mass analyzing the ribbon shaped ion beam, comprising of:

two planner magnet poles;

two field clamps, connects to the magnet poles;

two planner coils, each wound around a magnet pole, the path of the coil mainly follows the boundary of the magnet pole; the coil connects to the electrical power supply to produce the magnetic field in the spatial region between the two magnet poles;

a return yoke connects the two planner magnet poles;

a mass resolving aperture which is inside the spatial region between the two magnet poles to selectively pass only ions of the desired mass; and the said magnet is in substantial mirror symmetry to its mid-plane with one magnet pole, with one coil and one field clamp on each side; and the said spatial region between the two magnet poles serves as a spatial passageway for the traveling ion beam; and the said ribbon beam goes into the passageway of the magnet from the entrance end, the ribbon ion beam forms a focal spot in the middle of the passageway, the ribbon beam goes out of the passageway from the exit end.

18. The magnet unit of claim 17, wherein the magnet comprising, the first half magnet and the second half magnet, the first half magnet and the second half magnet are connected together with a connection cross-section, the first half magnet has an entrance end, the second half magnet has an exit end;

the said ion beam is the ribbon shaped ion beam, the short axis of the ribbon beam is aligned to the magnetic field of the magnet and the long axis of the ribbon beam lies on the mid-plane of the magnet, the ribbon beam goes into the first half magnet from the entrance end, the first half magnet bends and focuses the input ribbon ion beam, the ribbon ion beam forms a focal spot at the connection cross-section of the first half magnet and the second half magnet, then the second half magnet bends and expands the focal spot into a ribbon beam at the exit end of the second half magnet, the output ribbon beam is in general the one-to-one image transformation of the input ribbon beam;

the said surfaces of the magnet poles are carefully shaped, the magnet pole surfaces are shaped to provide either uniform magnetic field or non-uniform magnetic field between the two magnet poles;

the said ion beam curved orbit can be ellipse-like, the long axis of the ellipse is b and the short axis of the ellipse is a, the ratio of b/a is in the range of 1 to 3, a is in the range of 200 mm to 2000 mm;

the said magnet bends the ribbon beam through an angle between 90 degrees and 200 degrees, while the bending angle of 180 degrees is the preferred bending angle;

the said magnet pole can further include pole rotation end, the said pole rotation end can be set at the pole entrance end, the said pole rotation end can also be set at the pole exit end;

the entrance end of the first half pole and the exit end of the second half pole can be further trimmed as straight end or curved end;

the shape of the magnet poles can be further trimmed according to the envelope of the ribbon beam orbits in order to reduce the weight of the magnet poles, and the coil can be wound around the shape of the further trimmed magnet pole.

19. The ion implanter system of claim 16, wherein the ribbon beam width adjustor unit which comprise a first angle device and a second angle device, the first and the second angle device are located in the downstream of the said magnet unit, the two angle devices work together to either expand or compress the width of the ribbon beam from the magnet unit to different expected width.

20. The ribbon beam width adjustor of claim 19, wherein the first angle device is the Panofsky quadrupole magnet, the second angle device is also a Panofsky quadrupole magnet, the focusing mode, the defocusing mode, and the strength of the Panofsky quadrupole magnet can be adjusted by varying the polarity and the strength of the coil current of the Panofsky quadrupole magnet.

21. The ribbon beam width adjustor of claim 19, wherein the first angle device is the exit rotation pole end of the said magnet unit, the pole end rotation angle determines the focusing mode, the defocusing mode, and the strength of the first angle device; the second angle device is the Panofsky quadrupole magnet, the focusing mode, the defocusing mode, and the strength of the Panofsky quadrupole magnet can be adjusted by varying the polarity and the strength of the coil current of the Panofsky quadrupole magnet.

* * * * *